US012772446B2

(12) United States Patent
Xie et al.

(10) Patent No.: US 12,772,446 B2
(45) Date of Patent: Oct. 20, 2026

(54) THREE-DIMENSIONAL MEMORY DEVICE, HAVING BRIDGE STRUCTURE, AND METHODS FOR FORMING THE SAME

(71) Applicant: YANGTZE MEMORY TECHNOLOGIES CO., LTD., Wuhan (CN)

(72) Inventors: Jingtao Xie, Wuhan (CN); Bingjie Yan, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 734 days.

(21) Appl. No.: 17/868,680

(22) Filed: Jul. 19, 2022

(65) Prior Publication Data

US 2024/0032288 A1 Jan. 25, 2024

(51) Int. Cl.

| | |
|---|---|
| ***H10B 41/27*** | (2023.01) |
| ***G11C 16/04*** | (2006.01) |
| ***H10B 41/35*** | (2023.01) |
| ***H10B 43/27*** | (2023.01) |
| ***H10B 43/35*** | (2023.01) |

(52) U.S. Cl.

CPC ......... *H10B 41/27* (2023.02); *G11C 16/0483* (2013.01); *H10B 41/35* (2023.02); *H10B 43/27* (2023.02); *H10B 43/35* (2023.02)

(58) Field of Classification Search

CPC ........ H10B 41/27; H10B 43/35; H10B 41/35; H10B 43/27; G11C 16/0483

USPC .......................................................... 257/314

See application file for complete search history.

(56) References Cited

U.S. PATENT DOCUMENTS

| | | | | |
|---|---|---|---|---|
| 2017/0256551 A1* | 9/2017 | Lee | ........................ | H10B 41/40 |
| 2019/0139978 A1* | 5/2019 | Kim | ........................ | H10B 43/40 |
| 2021/0098288 A1* | 4/2021 | Zhou | ........................ | H10B 43/50 |
| 2021/0193676 A1* | 6/2021 | Zhang | .................... | H10B 43/50 |
| 2021/0384118 A1 | 12/2021 | Wang et al. | | |

FOREIGN PATENT DOCUMENTS

| | | |
|---|---|---|
| CN | 109754836 A | 5/2019 |
| CN | 111492480 A | 8/2020 |

* cited by examiner

*Primary Examiner* — Norman D Richards
*Assistant Examiner* — Colin Russell Mccutcheon
(74) *Attorney, Agent, or Firm* — BAYES PLLC

(57) ABSTRACT

A 3D includes a memory array structure. The memory array structure includes a first memory array structure and a second memory array structure each having a plurality of conductive/dielectric layer pairs. The memory array structure also includes a staircase structure between the first memory array structure and the second memory array structure. The staircase structure includes a first staircase zone and a second staircase zone. The first staircase zone includes at least one staircase, each including a plurality of stairs. The second staircase zone includes a bridge structure, and at least one other staircase over the bridge structure. The bridge structure connects the first memory array structure and the second memory array structure, the at least one other staircase each including a plurality of stairs. At least one stair in one or more of the at least one staircase is electrically connected to the bridge structure.

20 Claims, 22 Drawing Sheets

SS1

SS2
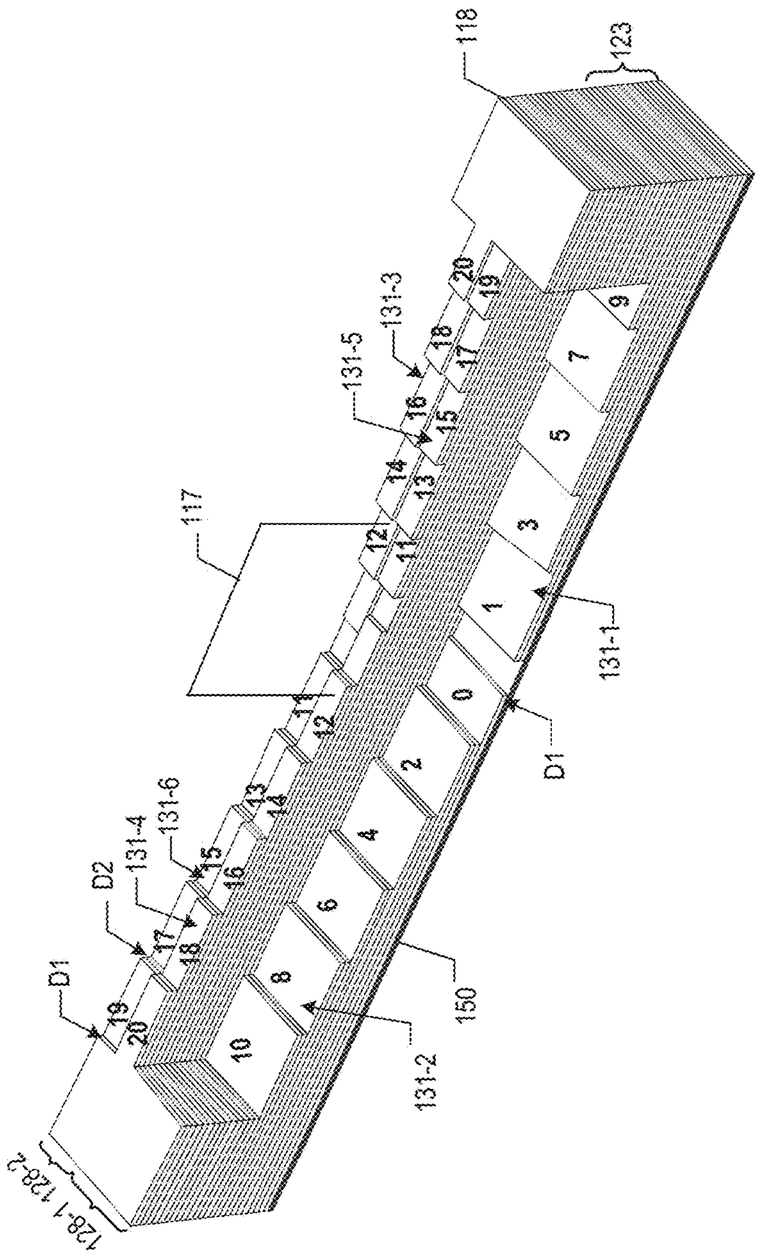
FIG. 1F
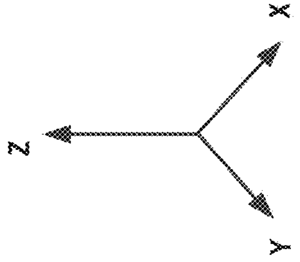

SS3

THREE-DIMENSIONAL MEMORY DEVICE, HAVING BRIDGE STRUCTURE, AND METHODS FOR FORMING THE SAME

BACKGROUND

The present disclosure relates to three-dimensional (3D) memory devices having staircases on a bridge structure and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY 3D memory devices having source-select-gate (SSG) cut structures and methods for forming the same are disclosed herein.

In one aspect, a 3D memory device includes a memory array structure. The memory array structure includes a first memory array structure and a second memory array structure each having a plurality of conductive/dielectric layer pairs. The memory array structure also includes a staircase structure between the first memory array structure and the second memory array structure. The staircase structure includes a first staircase zone and a second staircase zone. The first staircase zone includes at least one staircase, the at least one staircase each including a plurality of stairs. The second staircase zone includes a bridge structure, and at least one other staircase over the bridge structure. The bridge structure connects the first memory array structure and the second memory array structure, the at least one other staircase each including a plurality of stairs. At least one stair in one or more of the at least one staircase is electrically connected to the bridge structure.

In some implementations, the at least one staircase includes a first staircase and a second staircase aligned in a lateral direction, the first staircase and the second staircase each including a plurality of stairs; the at least one other staircase includes a third staircase and a fourth staircase; and at least one stair in one or more of the first staircase and the second staircase is electrically connected to the bridge structure.

In some implementations, the bridge structure includes a plurality of conductive/dielectric portion pairs; and the conductive/dielectric portion pairs each is in contact with a conductive/dielectric layer pair of a same depth in each of the first memory array structure and the second memory array structure.

In some implementations, each stair in the first staircase and the second staircase is in contact with a respective conductive/dielectric portion pair in the bridge structure; and each stair in the first staircase and the second staircase is electrically connected to a respective conductive/dielectric layer pair in each of the first memory array structure and the second memory array structure through the respective conductive/dielectric portion pair.

In some implementations, each stair in the third staircase and the fourth staircase is in contact with and electrically connected to a respective conductive/dielectric layer pair in one of the first memory array structure and the second memory array structure.

In some implementations, the third staircase and the fourth staircase have a same number of stairs; and at a same depth in a vertical direction, one of the stairs in the third staircase and one of the stairs in the fourth staircase are conductively connected through a conductive line, and are respectively in contact with and electrically connected to conductive/dielectric layer pairs of a same depth in one of the first memory array structure and the second memory array structure.

In some implementations, in a vertical direction, the first staircase and the second staircase are lower than each of the third staircase and the fourth staircase.

In some implementations, a highest stair in the first staircase is lower than a lowest stair of the second staircase by one conductive/dielectric portion pair.

In some implementations, the third staircase faces the fourth staircase in the lateral direction.

In some implementations, each stair in the first staircase, the second staircase, the third staircase, and the fourth staircase is defined by an edge of one conductive/dielectric pair.

In some implementations, the 3D memory device further includes a fifth staircase and a sixth staircase over the bridge structure. The fifth staircase is aligned with the third staircase in a second lateral direction perpendicular to the lateral direction. The sixth staircase is aligned with the fourth staircase in the second lateral direction. The fifth staircase and the sixth staircase each include a plurality of stairs.

In some implementations, each stair in the first staircase, the second staircase, the third staircase, the fourth staircase, the fifth staircase, and the sixth staircase are each defined by an edge of two conductive/dielectric pairs.

In some implementations, in a vertical direction, a highest stair of the third staircase and a highest stair of the fourth staircase are of a same depth; a highest stair of the fifth staircase is lower than a highest stair of the third staircase by one conductive/dielectric pair; and a highest stair of the sixth staircase is lower than a highest stair of the fourth staircase by one conductive/dielectric pair.

In some implementations, in the vertical direction, a highest stair in the first staircase is lower than a highest conductive/dielectric portion pair of the second staircase by one conductive/dielectric pair.

In some implementations, in the lateral direction, the third staircase faces the fourth staircase, and the fifth staircase faces the sixth staircase; and at a same depth in a vertical direction, one of the stairs in the third staircase and one of the stairs in the fourth staircase being conductively connected through a conductive line, one of the stairs in the fifth staircase and one of the stairs in the sixth staircase being conductively connected through another conductive line.

In some implementations, in the lateral direction, the third staircase faces the sixth staircase, and the fourth staircase faces the fifth staircase; and at a same depth in a vertical direction, one of the stairs in the third staircase and one of the stairs in the sixth staircase being conductively connected through a conductive line, one of the stairs in the fifth staircase and one of the stairs in the fourth staircase being conductively connected through another conductive line.

In another aspect, a 3D memory device includes a memory array structure having a first memory array structure and a second memory array structure each including a plurality of conductive/dielectric layer pairs. The 3D memory device also includes a staircase structure between the first memory array structure and the second memory array structure. The staircase structure includes a first staircase zone and a second staircase zone. The first staircase zone includes a first staircase and a second staircase electrically connected to a lower portion of each of the first memory array structure and the second memory array structure, the first staircase and the second staircase each including a plurality of stairs. The second staircase zone includes a third staircase and a fourth staircase electrically connected to an upper portion of a respective one of the first memory array structure and the second memory array structure. The first staircase, the second staircase, the third staircase, and the fourth staircase each includes a plurality of stairs.

In some implementations, the second staircase zone further includes a bridge structure electrically connected to each of the first memory array structure and the second memory array structure, the third staircase and the fourth staircase being over the bridge structure.

In some implementations, the third staircase and the fourth staircase have a same number of stairs; and at a same depth in a vertical direction, one of the stairs in the third staircase and one of the stairs in the fourth staircase are conductively connected through a conductive line, and are respectively in contact with and electrically connected to conductive/dielectric layer pairs of a same depth in one of the first memory array structure and the second memory array structure.

In some implementations, the 3D memory device further includes a fifth staircase and a sixth staircase over the bridge structure. The fifth staircase is aligned with the third staircase in a second lateral direction perpendicular to the lateral direction. The sixth staircase is aligned with the fourth staircase in the second lateral direction. The fifth staircase and the sixth staircase each includes a plurality of stairs.

In another aspect, a memory system includes a memory device configured to store data and including a memory array structure including a first memory array structure and a second memory array structure each including a plurality of conductive/dielectric layer pairs. A staircase structure is between the first memory array structure and the second memory array structure. The staircase structure includes a first staircase zone and a second staircase zone. The first staircase zone includes at least one staircase. The at least one staircase each includes a plurality of stairs. The second staircase zone includes a bridge structure, and at least one other staircase over the bridge structure. The bridge structure connects the first memory array structure and the second memory array structure. The at least one other staircase each includes a plurality of stairs. At least one stair in one or more of the at least one staircase is electrically connected to the bridge structure. A peripheral circuit is coupled to the memory cells. The memory system also includes a memory controller coupled to the memory device and configured to send a command to the peripheral circuit to cause the peripheral circuit to apply a voltage on the staircase structure.

In another aspect, a method for forming a staircase structure of a 3D memory device, includes patterning a first number of material layer pairs in a material stack to form a pair of first initial staircases aligned in a first lateral direction, and a second number of material layer pairs under the pair of first initial staircases, each of the first initial staircases including a plurality of first initial stairs; patterning, in a first staircase zone of the material stack, a first portion of the first initial staircases to form a pair of second initial staircases aligned in the first lateral direction, each of the second initial staircases including a plurality of second initial stairs; and retaining, in a second staircase zone of the material stack, a second portion of the first initial staircases, the first staircase zone and the second staircase zone each extending in the first lateral direction and are adjacent to each other in a second lateral direction perpendicular to the first lateral direction.

In some implementations, along a vertical direction, a highest stair of the second initial staircases is lower than a highest material pair of the second portion of the material layer pairs.

In some implementations, in the second lateral direction, the plurality of first initial stairs each fully extends in the first staircase zone and the second staircase zone; and each of the first initial stairs is defined by an edge of one material layer pair.

In some implementations, the method further includes patterning one of the second initial staircases to form a first staircase; retaining another one of the second initial staircase to form a second staircase; and retaining the second portion of the first initial staircases to form a third staircase and a fourth staircase.

In some implementations, patterning the first portion of the first initial staircases in the first staircase zone include: forming an etch mask to cover the second portion of the first initial staircases in the second staircase zone; and etching, along a vertical direction, the first initial staircases in the first staircase zone to form the pair of second third initial staircases by a first depth, the first depth being equal to a depth of the first initial staircases.

In some implementations, patterning one of the second initial staircases in the first staircase zone to form the first staircase includes: forming another etch mask to cover the other one of the second initial staircase in the first staircase zone; and etching, along a vertical direction, the one of the second initial staircases in the first staircase zone by a second depth, the second depth being equal to a depth of the second initial staircases.

In some implementations, along the vertical direction, a highest stair of the first staircases is lower than a lowest stair of the second staircase by one material layer pair.

In some implementations, the method further includes, prior to patterning the first number of material/second material layer pairs in the material stack, patterning the first staircase zone and the second staircase zone of the material stack to remove a respective portion of a top material layer pair in a first region and a second region, and form an etched portion and a retained portion in each of the first region and the second region. The first region and the second region are aligned with each other in the first lateral direction. In the second lateral direction, the etched portion of the first region extends fully across the first staircase zone and partially in the second staircase zone. The etched portion of the second region extends partially in the second staircase zone.

In some implementations, in the first lateral direction, the etched portion of the first region is aligned with the retained portion of the second region.

In some implementations, patterning the first number of material/second material layer pairs in the material stack to form the pair of first initial staircases includes forming the first initial staircases each in a respective one of the first region and the second region. Each of the first initial stairs includes a first division formed from the respective etched portion and a second division formed from the respective retained portion. Each of the first initial stairs is defined by a depth of two material layer pairs. For each of the first initial stairs, the first division is lower than the second division by a depth of one material layer pair.

In some implementations, in the first staircase zone: one of the second initial staircases in the first region forms a first staircase; and another one of the second initial staircases in the second region forms a second staircase. In the second staircase zone: the retained portion of one of the first initial staircases in the first region forms a third staircase; the retained portion of another one of the first initial staircases in the second region forms a fourth staircase; the etched portion of the first initial staircases in the first region forms a fifth staircase; and the etched portion of the other one of the first initial staircases in the second region forms a sixth staircase.

In some implementations, the method further includes, prior to patterning the first number of material/second material layer pairs in the material stack, patterning the second staircase zone of the material stack to remove a respective portion of a top material layer pair in a first region and a second region, and form an etched portion and a retained portion in each of the first region and the second region. The first region and the second region are aligned with each other in the first lateral direction. In the second lateral direction, the etched portion of the first region and the etched portion of the second region each extends partially in the second staircase zone.

In some implementations, in the first lateral direction, the etched portion of the first region is aligned with the etched portion of the second region.

In some implementations, patterning the first number of material/second material layer pairs in the material stack to form the pair of first initial staircases includes forming the first initial staircases each in a respective one of the first region and the second region. Each of the first initial stairs includes a first division formed from the respective etched portion and a second division formed from the respective retained portion. Each of the first initial stairs is defined by a depth of two material layer pairs. For each of the first initial stairs, the first division is lower than the second division by a depth of one material layer pair.

In some implementations, in the first staircase zone: one of the second initial staircases in the first region forms a first staircase; and another one of the second initial staircases in the second region forms a second staircase. In the second staircase zone: the retained portion of one of the first initial staircases and the first region forms a third staircase; the retained portion of another one of the first initial staircases in the second region forms a fourth staircase; the etched portion of the first initial staircases in the first region forms a fifth staircase; and the etched portion of the other one of the first initial staircases in the second region forms a sixth staircase.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

FIGS. 1E-1G each illustrates a top-front view of a staircase structure, according to implementations of the present disclosure.

Figure 1A:
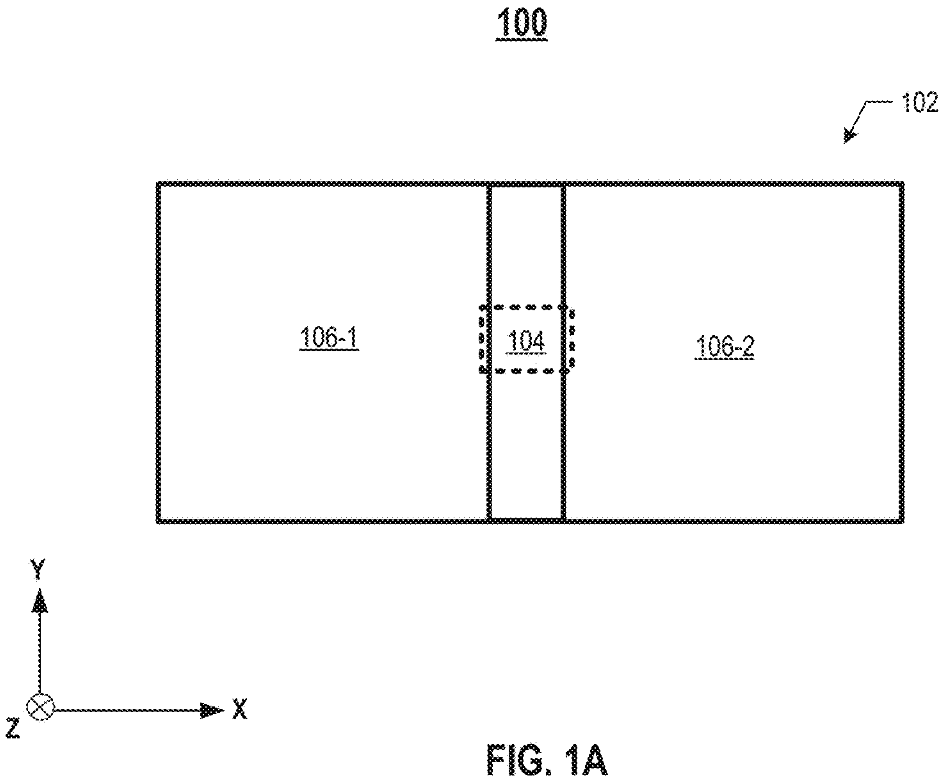
FIG. 1A illustrates a schematic diagram of an exemplary 3D memory device having a staircase structure, according to some implementations of the present disclosure.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one implementation," "an implementation," "an example implementation," "some implementations," etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or in a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cell transistors on a laterally-oriented substrate so that the memory cells extend in the vertical direction with respect to the substrate. As used herein, the term "vertical/vertically" means nominally perpendicular to the lateral surface of a substrate.

As used herein, the term "string" refers to one or more rows of memory cells (or channel structures) between source-select gate cut structures (or drain-select gate cut structures) and/or between a drain-select gate cut structure (or a source-select gate cute structure) and a slit structure.

As used herein, the "depth" of an object refers to the vertical distance from the top surface of the structure in which the object is located to the position of the object.

In some 3D memory devices, memory cells for storing data are vertically arranged in a stacked storage structure (e.g., a memory stack). As a solution for higher storage capacity, memory array structures in a 3D memory device are fabricated to have more levels, e.g., conductive/dielectric layer pairs, in a vertical direction to include more memory cells. The total thickness of the 3D memory device, e.g., the elevation of the memory stack, is thus increased. Meanwhile, to further maximize the chip area used for forming the memory cells, a staircase structure, employed to form an electrical connection between the memory array structures and a word line driver, is formed between a pair of memory array structures of the 3D memory device. The staircase structure includes a staircase that has a plurality of stairs, each defined by an edge of one or more conductive/dielectric layer pairs. Word line contacts are formed connecting the word line driver and the stairs. The staircase structure also includes a bridge structure, laterally coupled to the staircase. The bridge structure is often employed to provide an electrical connection between the stairs and the memory array structures, but does not directly provide electrical connection between the memory array structures and the word line driver. The depth of the staircase is often equal to the total depth/thickness of the bridge structure, which is equal to or slightly less than the total depth of the 3D memory device. As the thickness of the memory array structures increases, the depth of the staircase structure increases accordingly. As a result, the fabrication to form the staircase and surrounding structures can be more difficult. For example, it can be more difficult to etch and form all the stairs, deposit the insulating material over the stairs, or polish the insulating material. In another aspect, the increased thickness/levels of the 3D memory device requires more stairs to be formed, resulting in more area needed for the stairs.

Various implementations in accordance with the present disclosure provide staircase structures having stairs over the bridge structure and fabrication methods thereof. The staircase structure connects a pair of memory array structures, which include a plurality of memory cells for storing memory data. The staircase structure has a first staircase zone and a second staircase zone, in contact with each other. The staircase structure includes a plurality of stairs in each of the first staircase zone and the second staircase zone. The stairs extend in a lateral direction in which the memory array structures are aligned. Each of the stairs is electrically coupled to (e.g., in contact with) a word line (e.g., a conductive layer) of a respective level. The staircase structure also includes a bridge structure located in the second staircase zone and underneath the stairs. The stairs in both the first staircase zone and the second staircase zone provide electric connection between the respective word line and a word line driver. In some implementations, each stair in the first staircase zone is lower than any stair in the second staircase zone. Each stair in the first staircase zone is electrically coupled to the word lines of both the first and second memory array structures through the bridge structure. Each stair in the second staircase zone is electrically coupled to the word line of the first memory array structure or the second memory array structure. Stairs coupled to the same level of word line (e.g., conductive layer) may be electrically connected to each other.

In some implementations, each stair of the staircase structure is defined by the edge of a single conductive/dielectric layer pair (e.g., one level). The staircase structure may include a first staircase and a second staircase facing each other in the first staircase zone, and a third staircase and a fourth staircase facing each other in the second staircase zone. Each stair in the first staircase may be lower (e.g., closer to the substrate/semiconductor layer) than any stair in the second staircase. Each stair in the third staircase is higher than the highest stair of the second staircase. Each stair in the third staircase has the same depth as another stair in the fourth staircase.

In some implementations, each stair of the staircase structure is defined by the edge of two consecutive pairs of conductive/dielectric layer pairs. The staircase structure may include a first staircase and a second staircase facing each other in the first staircase zone. The lowest stair of the first staircase may be lower (e.g., closer to the substrate/semiconductor layer) than the lowest stair of the second staircase by one conductive/dielectric layer pair. The staircase structure may include a third staircase, a fourth staircase, a fifth staircase, and a sixth staircase in the second staircase zone. Each stair in the third staircase is at the same depth as another stair in the fourth staircase, and the two stairs are coupled to the word line of the same depth. Each stair in the fifth staircase is at the same depth as another stair in the sixth staircase, and the two stairs are coupled to the word line of the same depth. The lowest stair of the third/fourth staircase is higher than the lowest stair of the fifth/sixth stair by the depth of one conductive/dielectric layer pair. In some implementations, the third staircase faces the fourth staircase in the lateral direction, and the fifth staircase faces the sixth staircase in the lateral direction. In some implementations, the third staircase faces the sixth staircase in the lateral direction, and the fourth staircase faces the fifth staircase in the lateral direction.

The present disclosure provides ways to reduce the area required for forming more stairs, as the 3D memory device has more levels. As illustrated in the implementations, stairs, for connecting the word lines and the word line driver, are formed not only adjacent to the bridge structure, but also on the bridge structure. Compared to some devices, in which no stairs are formed on the bridge structure, the disclosed structures require less area for the stairs. The space/area, in the lateral direction, required for forming the stairs is reduced. In some implementations, two or more staircases can be formed on the bridge structures, in contact with one memory array structure, further reducing the area needed for forming the stairs. Also, because the stairs coupled to some of the word lines are distributed on the bridge structure, fewer stairs are formed in the staircases adjacent to the bridge structure. Compared to known devices, the depths of the staircases adjacent to the bridge structure are reduced, making it easier to deposit and polish the insulating material over the stairs in the subsequent fabrication process.

FIG. 1A illustrates a schematic diagram of an exemplary 3D memory device 100 having a staircase structure 104, according to some implementations of the present disclosure. In some implementations, 3D memory device 100 includes multiple memory planes 102. Each memory plane 102 can include a memory array structure 106-1/106-2 and a staircase structure 104 in the intermediate of memory array structure 106-1/106-2 and laterally dividing memory array structure 106-1/106-2 into a first memory array structure 106-1 and a second memory array structure 106-2 in the x-direction (the word line direction or a first lateral direction). In some implementations, memory array structure 106-1/106-2 is located in an array region of 3D memory device 100, and staircase structure 104 is located in a staircase region of 3D memory device 100. In some implementations, for each memory plane 102, staircase structure 104 is in the middle of memory array structure 106-1/106-2. That is, staircase structure 104 can be a center staircase structure, which equally divides memory array structure 106-1/106-2 into first and second memory array structures 106-1 and 106-2 with the same number of memory cells. For example, first and second memory array structures 106-1 and 106-2 may be symmetric in the x-direction with respect to center staircase structure 104. It is understood that in some examples, staircase structure 104 may be in the intermediate, but not in the middle (center), of memory array structure 106-1/106-2, such that first and second memory array structures 106-1 and 106-2 may have different sizes and/or numbers of memory cells. In some implementations, 3D memory device 100 is a NAND Flash memory device in which memory cells are provided in the form of an array of NAND memory strings (not shown) in first and second memory array structures 106-1 and 106-2. First and second memory array structures 106-1 and 106-2 can include any other suitable components including, but not limited to, gate line slits (GLSs), through array contacts (TACs), array common sources (ACSs), etc.

Each word line (not shown) of memory plane 102 extending laterally in the x-direction can be separated by staircase structure 104 into two parts: a first word line part across first memory array structure 106-1, and a second word line part across second memory array structure 106-2. The two parts of each word line at a lower portion of 3D memory device 100 can be conductively connected by a bridge structure (not shown in FIG. 1A) in staircase structure 104 at a respective stair in staircase structure 104. The two parts of each word line at an upper portion of 3D memory device 100 may be disconnected by stairs in staircase structure 104, but electrically connected to a word line driver through conductive vias (not shown in FIG. 1A). Memory array structure 106-1/106-2 may include a plurality of memory blocks each extending laterally in the x-direction and be separated by staircase structure 104 into two parts: a first memory block in first memory array structure 106-1 and a second memory block in second memory array structure 106-2. Each memory block can be divided into a pair of memory strings, each extending laterally in the x-direction can be separated by staircase structure 104 into two parts: a first memory string part in first memory array structure 106-1, and a second memory string part in second memory array structure 106-2. Stairs coupled/connected to first memory string part and the second memory string part of the same level may be electrically connected to each other, and further to the same string driver (as part of the word line driver).

Staircase structure 104 may be formed over a semiconductor layer 150. Semiconductor layer 150 can include silicon (e.g., single crystalline silicon or polysilicon), silicon germanium (SiGe), gallium arsenide (GaAs), germanium (Ge), silicon on insulator (SOI), germanium on insulator (GOI), or any other suitable materials. In some implementations, semiconductor layer 150 is a thinned substrate (e.g., a semiconductive layer), which was thinned by grinding, etching, chemical mechanical polishing (CMP), or any combination thereof. In some implementations, semiconductor layer 150 includes polysilicon.

Figure 1B:
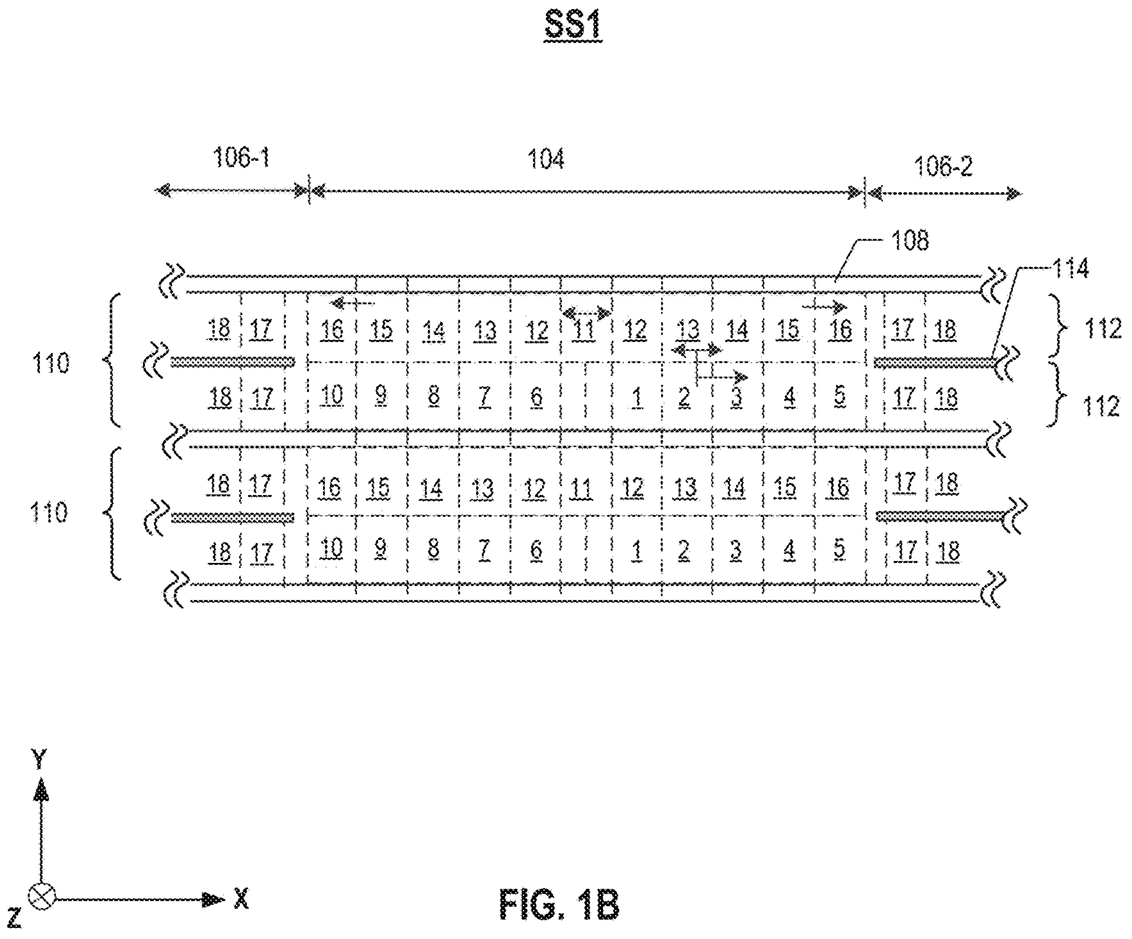
FIGS. 1B-1D each illustrates a top view of a staircase structure, according to implementations of the present disclosure.

FIG. 1B illustrates a top view of a first staircase structure ("SS1") in an exemplary 3D memory device, according to implementations of the present disclosure. FIG. 1E illustrates a top-front perspective view of part of the first staircase structure in the 3D memory device, according to some implementations of the present disclosure. The 3D memory device may be an example of 3D memory device 100, and the first staircase structure may be an example of staircase structure 104. For ease of illustration, FIGS. 1B and 1E are described together. For illustrative purposes, FIG. 1B shows a pair of first staircase structures adjacent to each other in the y-direction (e.g., a second lateral direction). FIG. 1E shows a single first staircase structure. For ease of explanation, FIGS. 1B and 1E are described together. As an example, FIGS. 1B and 1E illustrate 16 conductive/dielectric layer pairs 118 coupled to stairs.

As shown in FIGS. 1B and 1E, a first staircase structure may be located between a pair of slit structures 108. In some implementations, each slit structure includes a GLS, and a source contact structure is disposed in the GLS. The source contact structure can include a dielectric spacer and a source contact in the dielectric spacer. The dielectric spacer may include a dielectric material such as silicon oxide, silicon nitride, silicon oxynitride, etc. The source contact may include a conductive material such as tungsten, cobalt, aluminum, copper, silicides, polysilicon, or a combination thereof. The first staircase structure, between slit structures 108, may be electrically coupled to a memory block 110 (or memory cells in a memory block 110) in first and second memory array structures 106-1 and 106-2. In some implementations, the first staircase structure is part of memory block 110. Memory block 110 may include a plurality of conductive/dielectric layer pairs 118 stacked in the z-direction, and a plurality of channel structures (not shown) intersecting with conductive/dielectric layer pairs 118. Each conductive/dielectric layer pair 118 may include a conductive layer and a dielectric layer. The conductive layer can include conductor materials including, but not limited to, tungsten (W), cobalt (Co), copper (Cu), aluminum (Al), polycrystalline silicon (polysilicon), doped silicon, silicides, or any combination thereof. The dielectric layer can include dielectric materials including, but not limited to, silicon oxide, silicon nitride, silicon oxynitride, or any combination thereof. In some implementations, the conductive layers include metals, such as tungsten, and the dielectric layers include silicon oxide. Memory block 110 may include a plurality of strings 112, which are divided by a source-select gate (SSG) cut structure 114, which can include a dielectric material such as silicon oxide. During operations, strings 112 can be selectively controlled by applying voltages on the conductive vias coupled to the strings 112.

The first staircase structure may include a first staircase zone 128-1 and a second staircase zone 128-2, adjacent to each other in the y-direction. In first staircase zone 128-1, the first staircase structure may include a first staircase 130-1 and a second staircase 130-2, facing each other in the x-direction. First staircase 130-1 and second staircase 130-2 may each include a plurality of stairs, extending in the x-direction. Each stair of the first and second staircases 130-1 and 130-2 may be defined by the edge of one (e.g., a single) conductive/dielectric layer pair 118. In some implementations, first and second staircases 130-1 and 130-2 each includes a plurality of consecutive stairs, e.g., each stair being lower than an immediate upper stair by a depth of D1 (i.e., thickness of a single conductive/dielectric layer pair 118). In some implementations, the highest stair of first staircase 130-1 is lower than the lowest stair (or each stair) of second staircase 130-2 by at least D1. As an example, as shown in FIGS. 1B and 1E, first staircase 130-1 may include five stairs (e.g., stairs 1, 2, 3, 4, 5), and second staircase 130-2 may include five stairs (e.g., stairs 6, 7, 8, 9, 10). Stair 5 may be lower than stair 6 by D1. In this disclosure, the stair number corresponds to the conductive/dielectric layer pair number in first and second memory array structures 106-1 and 106-2. For example, stair 1 corresponds to (e.g., is level with or electrically connected to) the first conductive/dielectric layer pair 118, stair 0 corresponds to (e.g., is level with or electrically connected to) the $0^{th}$ conductive/dielectric layer pair 118. It should be noted that the specific stair number is not meant to limit the number of stairs or conductive/dielectric layer pairs 118 over semiconductor layer 150, but to merely differentiate different depths of stairs (or different conductive/dielectric layer pairs) in the 3D memory devices.

In second staircase zone 128-2, the second staircase structure may include a third staircase 130-3 and a fourth staircase 130-4, facing each other in the x-direction. Third staircase 130-3 and fourth staircase 130-4 may each include a plurality of stairs, extending in the x-direction. Each stair of the third and fourth staircases 130-3 and 130-4 may be defined by the edge of one (e.g., a single) conductive/dielectric layer pair 118. In some implementations, third and fourth staircases 130-3 and 130-4 each includes a plurality of consecutive stairs, e.g., each stair being lower than an immediate upper stair by a depth of D1. In some implementations, third staircase 130-3 and fourth staircase 130-4 are symmetrical about they-direction. As an example, as shown in FIGS. 1B and 1E, third staircase 130-3 may include five stairs (e.g., stairs 12, 13, 14, 15, 16), and fourth staircase 130-4 may include five stairs (e.g., stairs 12, 13, 14, 15, 16). In third and fourth staircases 130-3 and 130-4, stairs denoted with the same numbers are of the same depth and are electrically coupled to the conductive/dielectric layer pair 118 of the same depth in the respective memory array structure. For example, stair 12 of third staircase 130-3 may be electrically coupled to part (a second word line part) of a conductive/dielectric layer pair 118 in second memory array structure 106-2, and stair 12 of fourth staircase 130-4 may be electrically coupled to another part (a first word line part) of the same conductive/dielectric layer pair 118 in first memory array structure 106-1. Stairs denoted of the same number in third staircase 130-3 and fourth staircase 130-4 (e.g., stairs 12) may be electrically connected, e.g., though a conductive line or a metal line, and may together be electrically connected to a string driver. In some implementations, the lowest stair in third staircase 130-3 (or fourth staircase 130-4) may be higher than the highest stair in the first staircase zone (e.g., stair 10) by at least D1.

In second staircase zone 128-2, the second staircase structure may further include a bridge structure 121 under third and fourth staircases 130-3 and 130-4. Bridge structure 121 may include a plurality of conductive/dielectric portion pairs stacked in the z-direction. The conductive/dielectric portion pairs may include the same materials as (or considered as extensions of) conductive/dielectric layer pairs 118. Each conductive/dielectric portion pair is in contact with and electrically connected to the conductive/dielectric layer pair of the same depth in each of first and second memory array structures 106-1 and 106-2. In other words, each conductive/dielectric portion pair is electrically connected to both of first and second memory array structures 106-1 and 106-2. The highest conductive/dielectric portion pair of bridge structure 121 may be lower than the lowest stair of third staircase 130-3 (or fourth staircase 130-4). For example, an area 11 may be part of the highest conductive/dielectric portion pair of bridge structure 121 between third staircase 130-3 and fourth staircase 130-4. Area 11 may be electrically connected to both the respective conductive/dielectric layer pair 118 in both first and second memory array structures 106-1 and 106-2.

As shown in FIGS. 1B and 1E, stairs 1-10, area 11, stairs 12-16 are each electrically coupled to a conductive/dielectric layer pair 118 of a respective depth. Specifically, stairs in first staircase zone 128-1 (e.g., stairs 1-10) may each be in contact with and electrically connected to a respective conductive/dielectric portion pair in bridge structure 121, and may be electrically connected to a respective conductive/dielectric layer pair in each of first and second memory array structures 106-1 and 106-2 through the respective conductive/dielectric portion pair. As shown in FIG. 1B, electric current, when a voltage is applied on stair 2 by a conductive via, may be transmitted to first and second memory array structures 106-1 and 106-2 through bridge structure 121. The electric current may also be transmitted to second memory array structure 106-2 without bridge structure 121 due to the direct coupling between stair 2 and second memory array structure 106-2.

Meanwhile, stairs in second staircase zone 128-2 (e.g., stairs 12-16) may each be in contact with and electrically connected to a respective conductive/dielectric layer pair in one of first and second memory array structures 106-1 and 106-2, without bridge structure 121. As shown in FIG. 1B, electric current, when a voltage is applied on stair 15 of third staircase 130-3, may be transmitted to second memory array structure 106-2 directly (e.g., without bridge structure 121). Electric current, when a voltage is applied on stair 15 of fourth staircase 130-4, may be transmitted to first memory array structure 106-1 directly. Electric current, when a voltage is applied on area 11 of bridge structure 121, may be transmitted to first and second memory array structures 106-1 and 106-2 directly.

A conductive via, e.g., a word line contact, may be landed on each of stairs/area 1-16 such that strings in first and second memory array structures 106-1 and 106-2 are electrically connected to respective string drivers. In some implementations, conductive vias on the stairs of the same depth in second staircase zone 128-2 may be electrically connected to each other through a conductive (e.g., metal) line 116, which is further electrically connected to a string driver. In operation, the same string 112 in each of first and second memory array structures 106-1 and 106-2 can be driven at the same time. As shown in FIG. 1E, the number of conductive/dielectric portion pairs in bridge structure 121 may be equal to or greater than the total number of stairs in first staircase zone 128-1. In some implementations, in the y-direction, stairs in first staircase 130-1 and third staircase 130-3 are aligned with each other, and stairs in second staircase 130-2 and fourth staircase 130-4 are aligned with each other. In some implementations, first staircase 130-1, second staircase 130-2, third staircase 130-3, and fourth staircase 130-4 may have the same number of stairs.

As shown in FIG. 1B, first and second memory array structures 106-1 and 106-2 may each include more stairs, e.g., stairs 17, 18, above stairs/area 1-16. SSG cut structures 114 may laterally extend in these stairs, e.g., stairs 17 and 18, and divide memory block 110 into a plurality of strings 112. A conductive via may be landed on each of these stairs. When a voltage is applied on the conductive vias, strings 112 may be selected for desired operations. SSG cut structures 114 may extend in first and second memory array structures 106-1 and 106-2. Although not shown, more than one SSG cut structures 114 may be in first and second memory array structures 106-1 and 106-2 and dividing memory block 110 into more than two strings 112. The division of strings 112 may be independent of the layout of stairs in the first staircase structure. In various implementations, first and second memory array structures 106-1 and 106-2 may each include 2, 4, or 6 strings 112, regardless of the number of staircase zones in the first staircase structure.

Figure 1C:
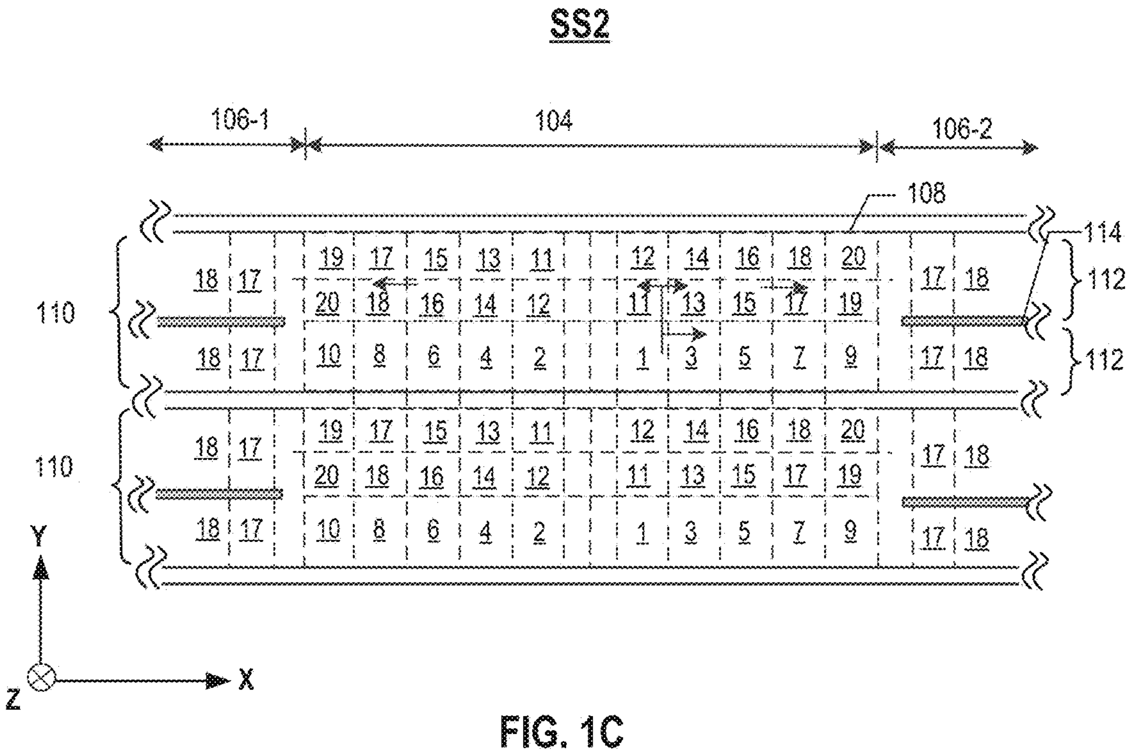

FIG. 1C illustrates a top view of a second staircase structure ("SS2") in an exemplary 3D memory device, according to implementations of the present disclosure. FIG. 1F illustrates a top-front perspective view of part of the second staircase structure in the 3D memory device, according to some implementations of the present disclosure. The 3D memory device may be an example of 3D memory device 100, and the second staircase structure may be an example of staircase structure 104. For ease of illustration, FIGS. 1C and 1F are described together. For illustrative purposes, FIG. 1C shows a pair of second staircase structures adjacent to each other in the y-direction. FIG. 1F shows a single second staircase structure. For ease of explanation, FIGS. 1C and 1F are described together. As an example, FIGS. 1C and 1F illustrate 20 conductive/dielectric layer pairs 118 coupled to the stairs.

As shown in FIGS. 1C and 1F, a second staircase structure may be located between a pair of slit structures 108. The detailed description of GLS, conductive/dielectric layer pairs 118, memory block 110, strings 112, SSG cut structure 114 may be similar to those of the first staircase structure, and is not repeated herein.

The second staircase structure may include a first staircase zone 128-1 and a second staircase zone 128-2, adjacent to each other in the y-direction. In first staircase zone 128-1, the first staircase structure may include a first staircase 131-1 and a second staircase 131-2, facing each other in the x-direction. First staircase 131-1 and second staircase 131-2 may each include a plurality of stairs, extending in the x-direction. Each stair of the first and second staircases 131-1 and 131-2 may be defined by the edge of two conductive/dielectric layer pairs 118. In some implementations, first and second staircases 131-1 and 131-2 each includes a plurality of consecutive stairs, e.g., each stair being lower than an immediate upper stair by a depth D2 (i.e., the thickness of two conductive/dielectric layer pairs 118). In some implementations, the lowest stair of first staircase 131-1 is lower than the lowest stair of second staircase 131-2 by a depth of D1. As an example, as shown in FIGS. 1C and 1F, first staircase 131-1 may include five stairs (e.g., stairs 1, 3, 5, 7, 9), and second staircase 130-2 may include five stairs (e.g., stairs 2, 4, 6, 8, 10). Stair 1 may be lower than stair 2 by a depth of D1.

In second staircase zone 128-2, the second staircase structure may include a third staircase 131-3 and a fourth staircase 131-4. Third staircase 131-3 and fourth staircase 131-4 may each include a plurality of stairs, extending in the x-direction. Each stair of the third and fourth staircases 131-3 and 131-4 may be defined by the edge of two conductive/dielectric layer pairs 118. In some implementations, third and fourth staircases 131-3 and 131-4 each includes a plurality of consecutive stairs, e.g., each stair being lower than an immediate upper stair by a depth D2. As an example, as shown in FIGS. 1C and 1F, third staircase 131-3 may include five stairs (e.g., stairs 12, 14, 16, 18, 20) and fourth staircase 131-4 may include five stairs (e.g., stairs 12, 14, 16, 18, 20). In third and fourth staircases 131-3 and 131-4, stairs denoted with the same numbers are of the same depth and are electrically coupled to the conductive/dielectric layer pair 118 of the same depth in the respective memory array structure. For example, stair 12 of third staircase 131-3 may be electrically coupled to part (a second word line part) of a conductive/dielectric layer pair 118 in second memory array structure 106-2, and stair 12 of fourth staircase 131-4 may be electrically coupled to another part (a first word line part) of the same conductive/dielectric layer pair 118 in first memory array structure 106-1. Stairs denoted of the same number in third staircase 131-3 and fourth staircase 131-4 (e.g., stairs 12) may be electrically connected, e.g., though a conductive line or a metal line, and may together be electrically connected to the same string driver.

In second staircase zone 128-2, the second staircase structure may include a fifth staircase 131-5 and a sixth staircase 131-6. Fifth staircase 131-5 and sixth staircase 131-6 may each include a plurality of stairs, extending in the x-direction. Each stair of the fifth and sixth staircases 131-5 and 131-6 may be defined by the edge of two conductive/dielectric layer pairs 118. In some implementations, fifth and sixth staircases 131-5 and 131-6 each includes a plurality of consecutive stairs, e.g., each stair being lower than an immediate upper stair by a depth D2. As an example, as shown in FIGS. 1C and 1F, fifth staircase 131-5 may include five stairs (e.g., stairs 11, 13, 15, 17, 19) and sixth staircase 131-6 may include five stairs (e.g., stairs 11, 13, 15, 17, 19). In fifth and sixth staircases 131-5 and 131-6, stairs denoted with the same numbers are of the same depth and are electrically coupled to the conductive/dielectric layer pair 118 of the same depth in the respective memory array structure. For example, stair 11 of fifth staircase 131-5 may be electrically coupled to part (a second word line part) of a conductive/dielectric layer pair 118 in second memory array structure 106-2, and stair 11 of sixth staircase 131-6 may be electrically coupled to another part (a first word line part) of the same conductive/dielectric layer pair 118 in first memory array structure 106-1. Stairs denoted of the same number in fifth staircase 131-5 and sixth staircase 131-6 (e.g., stairs 11) may be electrically connected, e.g., though a conductive line or a metal line, and may together be electrically connected to the same string driver.

Third staircase 131-3 and fifth staircase 131-5 may be aligned with each other in they-direction such that the stairs of third staircase 131-3 are aligned with respective stairs of fifth staircase 131-5 in the y-direction. For example, stair 11 of third staircase 131-3 may be aligned with stair 12 of fifth staircase 131-5. The depths of the two stairs (respectively of third and fifth staircases 131-3 and 131-5) aligned in the y-direction may have an offset of D1 such that the two stairs are electrically coupled to different conductive/dielectric layer pairs. For example, stair 12 of third staircase 131-3 may be higher than stair 11 of fifth staircase 131-5 by a depth of D1. In some implementations, the lowest stair of third staircase 131-3 may be higher than the lowest stair of fifth staircase 131-5 by a depth of D1. Because stairs of fourth staircase 131-4 have the same depths as third staircase 131-3, and stairs of sixth staircase 131-6 have the same depths as fifth staircase 131-5, the depths of the two stairs (respectively of fourth and sixth staircases 131-4 and 131-6) aligned in they-direction may have an offset of D1. For example, stair 11 of sixth staircase 131-6 may be lower than stair 12 of fourth staircase 131-4 by a depth of D1. In some implementations, in the x-direction, third staircase 131-3 faces sixth staircase 131-6, and fourth staircase 131-4 faces fifth staircase 131-5.

In second staircase zone 128-2, the second staircase structure may further include a bridge structure 123 under third staircase 131-3, fourth staircase 131-4, fifth staircase 131-5, and sixth staircase 131-6. Bridge structure 123 may include a plurality of conductive/dielectric portion pairs stacked in the z-direction. The structure and materials of bridge structure 123 may be similar to those of bridge structure 121, and the detailed description is not repeated herein. The highest conductive/dielectric portion pair of bridge structure 123 may be lower than the lowest stair of fifth staircase 131-5 (or sixth staircase 131-6). For example, the area between fifth staircase 131-5 and sixth staircase 131-6 may be coplanar with or higher than the top (e.g., highest) surface of the bridge structure. The area may or may not include stairs. The stairs, if any, may be electrically connected to the respective conductive/dielectric layer pair 118 in the respective one of first and second memory array structures 106-1 and 106-2, and may or may not be used for connecting strings 112 and a string driver.

As shown in FIGS. 1C and 1F, stairs 1-10 are each electrically coupled to a conductive/dielectric layer pair 118 of a respective depth. Specifically, stairs in first staircase zone 128-1 (e.g., stairs 1-10) may each be in contact with and electrically connected to a respective conductive/dielectric portion pair in bridge structure 123, and may be electrically connected to a respective conductive/dielectric layer pair in each of first and second memory array structures 106-1 and 106-2 through the respective conductive/dielectric portion pair. As shown in FIG. 1C, electric current, when a voltage is applied on stair 1 by a conductive via, may be transmitted to first and second memory array structures 106-1 and 106-2 through bridge structure 123. The electric current may also be transmitted to second memory array structure 106-2 without bridge structure 123 due to the direct coupling between stair 1 and second memory array structure 106-2.

Meanwhile, stairs in second staircase zone 128-2 (e.g., stairs 11-20) may each be in contact with and electrically connected to a respective conductive/dielectric layer pair in one of first and second memory array structures 106-1 and 106-2, without bridge structure 123. As shown in FIG. 1C, electric current, when a voltage is applied on stair 15 of fifth staircase 131-5, may be transmitted to second memory array structure 106-2 directly (e.g., without bridge structure 123). Electric current, when a voltage is applied on stair 16 of fourth staircase 131-4, may be transmitted to first memory array structure 106-1 directly. Electric current, when a voltage is applied on a stair (if any) between third staircase 131-3 (or fifth staircase 131-5) and fourth staircase 131-4 (of sixth staircase 131-6), may be transmitted to one or both of first and second memory array structures 106-1 and 106-2 directly.

Similar to those of the first staircase structure, stairs, in second staircase zone 128-2, of the same depths may be electrically coupled to the same string driver. In some implementations, a conductive (e.g., metal) line 117 may be employed to electrically connect (or in contact with) the conductive vias on the stairs of the same depth in second staircase zone 128-2. In operation, the same string 112 in each of first and second memory array structures 106-1 and 106-2 can be driven at the same time. As shown in FIG. 1F, the number of conductive/dielectric portion pairs in bridge structure 123 may be equal to or greater than the total number of stairs in first staircase zone 128-1. In some implementations, in they-direction, stairs in first staircase 131-1, third staircase 131-3, and fifth staircase 131-5 are aligned with each other, and stairs in second staircase 131-2, fourth staircase 131-4, and sixth staircase 131-6 are aligned with each other. In some implementations, first staircase 131-1, second staircase 131-2, third staircase 131-3, and fourth staircase 131-4, fifth staircase 131-5, and sixth staircase 131-6 may have the same number of stairs.

Figure 1D:
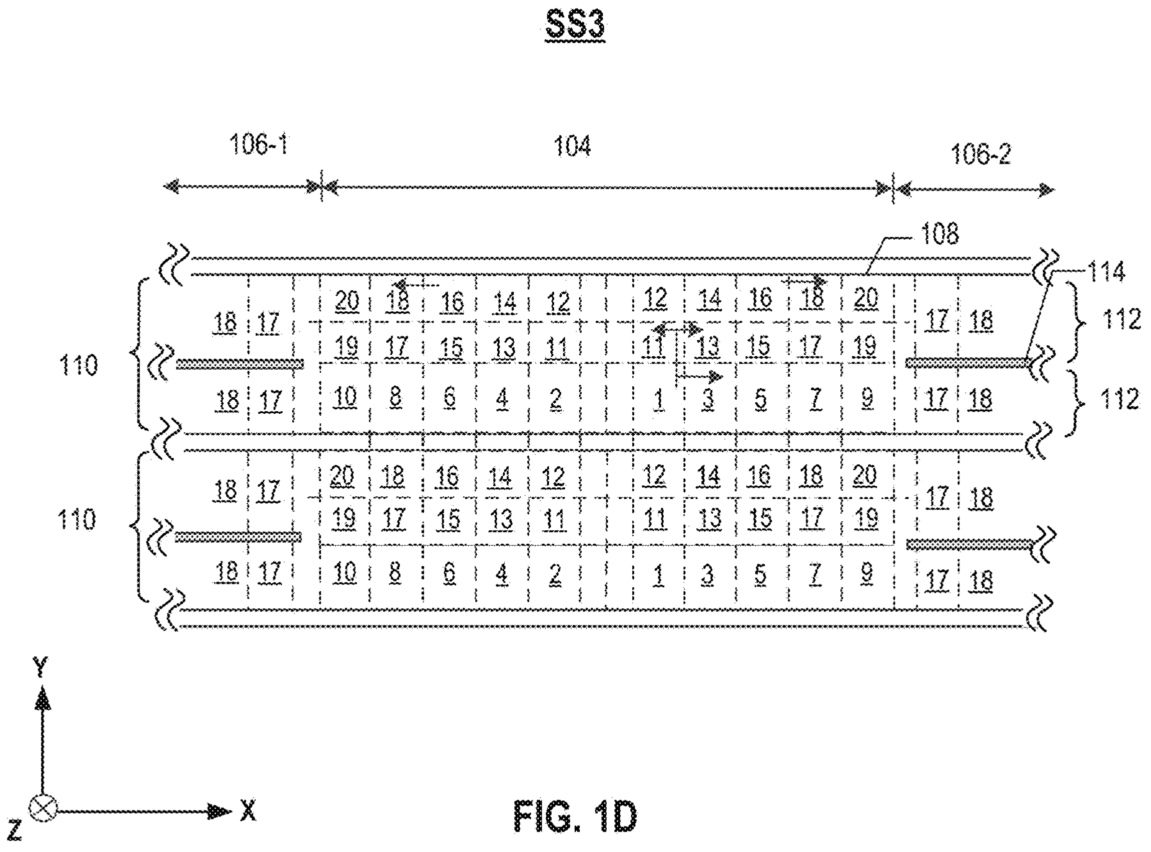
Figure 1E:
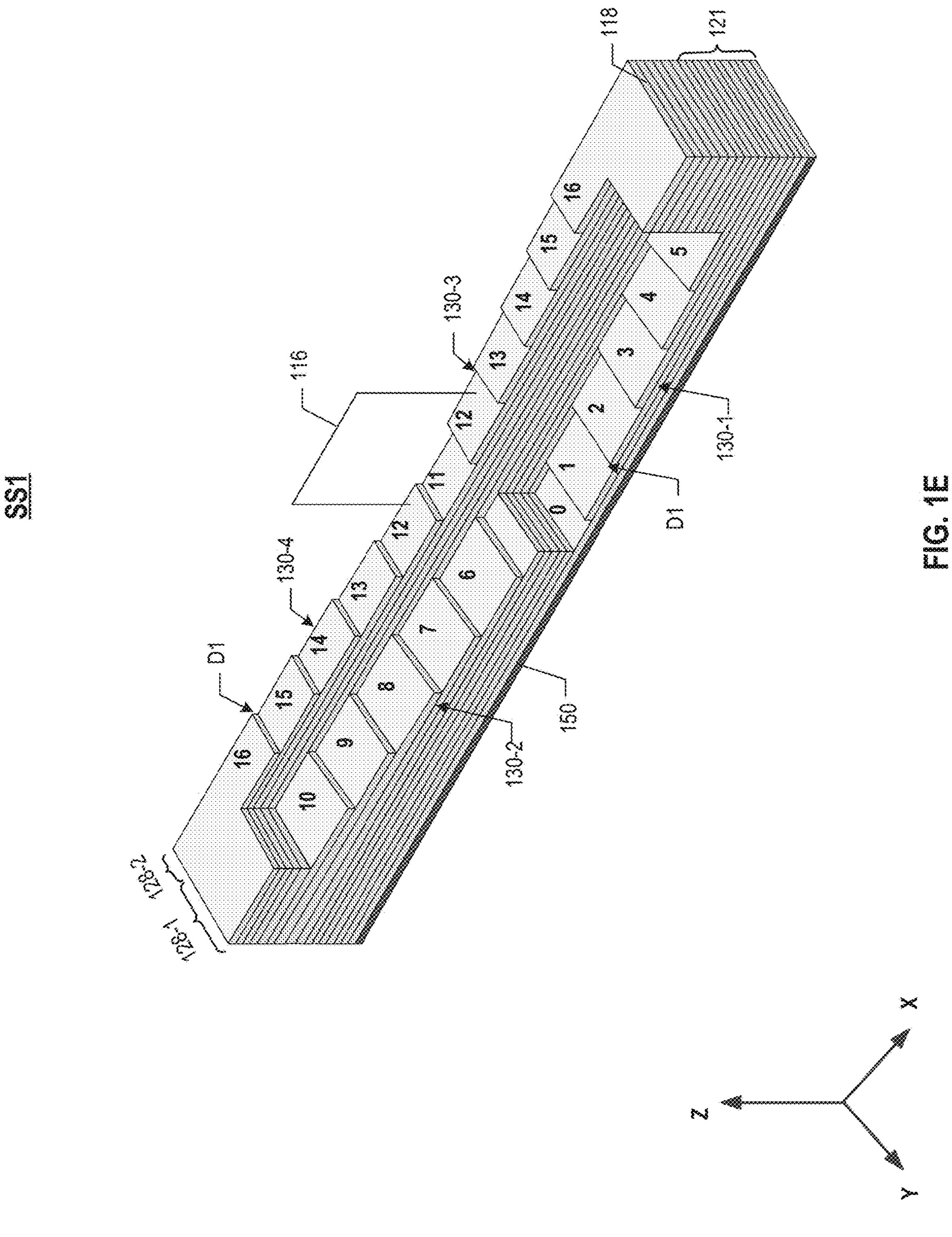
Figure 1G:
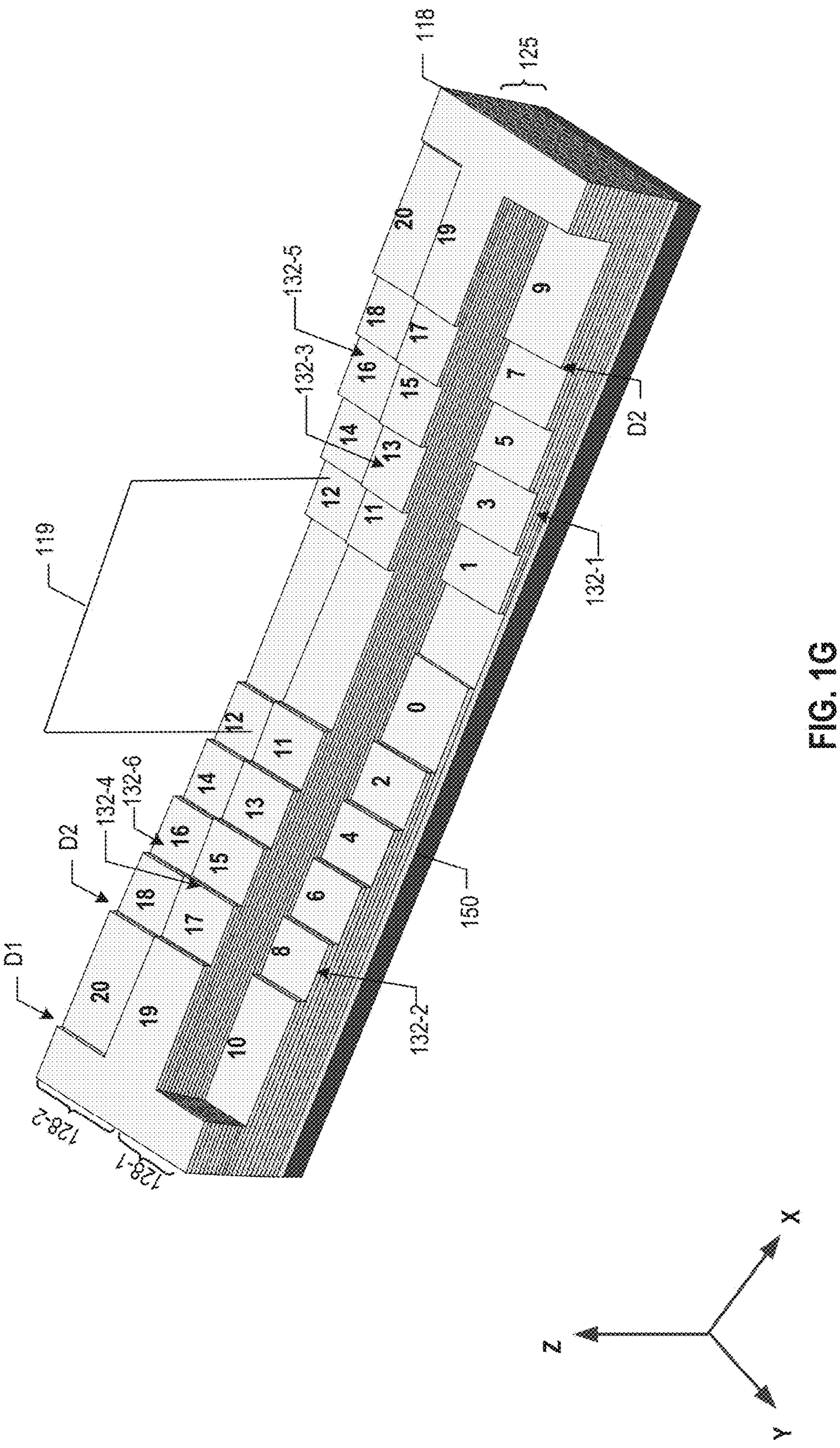

FIG. 1D illustrates a top view of a third staircase structure ("SS3") in an exemplary 3D memory device, according to implementations of the present disclosure. FIG. 1G illustrates a top-front perspective view of part of the third staircase structure in the 3D memory device, according to some implementations of the present disclosure. The 3D memory device may be an example of 3D memory device 100, and the third staircase structure may be an example of staircase structure 104. For ease of illustration, FIGS. 1F and 1G are described together. For illustrative purposes, FIG. 1D shows a pair of third staircase structures adjacent to each other in they-direction. FIG. 1G shows a single third staircase structure. For ease of explanation, FIGS. 1D and 1G are described together. As an example, FIGS. 1D and 1G illustrate 20 conductive/dielectric layer pairs 118 coupled to stairs.

As shown in FIGS. 1D and 1G, a third staircase structure may be located between a pair of slit structures 108. The detailed description of GLS, conductive/dielectric layer pairs 118, memory block 110, strings 112, SSG cut structure 114 may be similar to those of the first staircase structure, and is not repeated herein.

The third staircase structure may include a first staircase zone 128-1 and a second staircase zone 128-2, adjacent to each other in the y-direction. In first staircase zone 128-1, the first staircase structure may include a first staircase 132-1 and a second staircase 132-2, facing each other in the x-direction. First and second staircases 132-1 and 132-2 may be similar to those of the second staircase structure, and the detailed description is not repeated herein.

In second staircase zone 128-2, the second staircase structure may include a third staircase 132-3 and a fourth staircase 132-4. Third staircase 132-3 and fourth staircase 132-4 may each include a plurality of stairs, extending in the x-direction. Similar to third and fourth staircases 131-3 and 131-4, each stair of the third and fourth staircases 132-3 and 132-4 may be defined by the edge of two conductive/dielectric layer pairs 118. As an example, as shown in FIGS. 1D and 1G, third staircase 132-3 may include five stairs (e.g., stairs 11, 13, 15, 17, 19) and fourth staircase 132-4 may include five stairs (e.g., stairs 11, 13, 15, 17, 19). In third and fourth staircases 132-3 and 132-4, stairs denoted with the same numbers are of the same depth and are electrically coupled to the conductive/dielectric layer pair 118 of the same depth in the respective memory array structure. For example, stair 11 of third staircase 132-3 may be electrically coupled to part (a second word line part) of a conductive/dielectric layer pair 118 in second memory array structure 106-2, and stair 11 of fourth staircase 132-4 may be electrically coupled to another part (a first word line part) of the same conductive/dielectric layer pair 118 in first memory array structure 106-1. Stairs denoted of the same number in third staircase 132-3 and fourth staircase 132-4 (e.g., stairs 11) may be electrically connected, e.g., though a conductive via or a metal via, and may together be electrically connected to a same string driver. Different from the second staircase structure, third staircase 132-3 and fourth staircase 132-4 face each other in the x-direction.

In second staircase zone 128-2, the second staircase structure may include a fifth staircase 132-5 and a sixth staircase 132-6. Fifth staircase 132-5 and sixth staircase 132-6 may each include a plurality of stairs, extending in the x-direction. Similar to fifth and sixth staircases 131-5 and 131-6, each stair of the fifth and sixth staircases 132-5 and 132-6 may be defined by the edge of two conductive/dielectric layer pairs 118. As an example, as shown in FIGS. 1D and 1G, fifth staircase 132-5 may include five stairs (e.g., stairs 12, 14, 16, 18, 20) and sixth staircase 132-6 may include five stairs (e.g., stairs 12, 14, 16, 18, 20). In fifth and sixth staircases 132-5 and 132-6, stairs denoted with the same numbers are of the same depth and are electrically coupled to the conductive/dielectric layer pair 118 of the same depth in the respective memory array structure. For example, stair 12 of fifth staircase 132-5 may be electrically coupled to part (a second word line part) of a conductive/dielectric layer pair 118 in second memory array structure 106-2, and stair 12 of sixth staircase 132-6 may be electrically coupled to another part (a first word line part) of the same conductive/dielectric layer pair 118 in first memory array structure 106-1. Stairs denoted of the same number in fifth staircase 132-5 and sixth staircase 132-6 (e.g., stairs 12) may be electrically connected, e.g., though a conductive via or a metal via, and may together be electrically connected to a same string driver. Different from the second staircase structure, fifth staircase 132-5 and sixth staircase 132-6 face each other in the x-direction.

Third staircase 132-3 and fifth staircase 132-5 may be aligned with each other in the y-direction such that the stairs of third staircase 132-3 are aligned with respective stairs of fifth staircase 132-5 in the y-direction. For example, stair 11 of third staircase 132-3 may be aligned with stair 12 of fifth staircase 132-5. The depths of the two stairs (respectively of third and fifth staircases 132-3 and 132-5) aligned in the y-direction may have an offset of D1 such that the two stairs are electrically coupled to different conductive/dielectric layer pairs. For example, stair 11 of third staircase 132-3 may be higher than stair 12 of fifth staircase 132-5 by a depth of D1. In some implementations, the lowest stair of third staircase 132-3 may be higher than the lowest stair of fifth staircase 132-5 by a depth of D1. Because stairs of fourth staircase 132-4 have the same depths as third staircase 132-3, and stairs of sixth staircase 132-6 have the same depths as fifth staircase 132-5, the depths of the two stairs (respectively of fourth and sixth staircases 132-4 and 132-6) aligned in they-direction may have an offset of D1. For example, stair 12 of sixth staircase 132-6 may be lower than stair 11 of fourth staircase 132-4 by a depth of D1.

In second staircase zone 128-2, the second staircase structure may further include a bridge structure 123 under third staircase 132-3, fourth staircase 132-4, fifth staircase 132-5, and sixth staircase 132-6. Bridge structure 123 may include a plurality of conductive/dielectric portion pairs stacked in the z-direction. Bridge structure 125 may be similar to those of bridge structure 123, and the detailed description is not repeated herein. The highest conductive/dielectric portion pair of bridge structure 125 may lower than the lowest stair of fifth staircase 132-5 (or sixth staircase 132-6). For example, the area between fifth staircase 131-5 and sixth staircase 131-6 may be coplanar with or higher than the top (e.g., highest) surface of bridge structure. The area may or may not be used for connecting strings 112 and a string driver.

As shown in FIGS. 1D and 1G, stairs 1-10 are each electrically coupled to a conductive/dielectric layer pair 118 of a respective depth. Similar to those of the second staircase structure, as shown in FIG. 1D, electric current, when a voltage is applied on stair 1 by a conductive via, may be transmitted to first and second memory array structures 106-1 and 106-2 through bridge structure 125. The electric current may also be transmitted to second memory array structure 106-2 without bridge structure 125 due to the direct coupling between stair 1 and second memory array structure 106-2.

Meanwhile, stairs in second staircase zone 128-2 (e.g., stairs 11-20) may each be in contact with and electrically connected to a respective conductive/dielectric layer pair in one of first and second memory array structures 106-1 and 106-2, without bridge structure 125. As shown in FIG. 1D, electric current, when a voltage is applied on stair 16 of third staircase 132-3, may be transmitted to second memory array structure 106-2 directly (e.g., without bridge structure 125). Electric current, when a voltage is applied on stair 16 of sixth staircase 132-6, may be transmitted to first memory array structure 106-1 directly. Electric current, when a voltage is applied on a stair (if any) between third staircase 132-3 (or fifth staircase 132-5) and fourth staircase 132-4 (of sixth staircase 132-6), may be transmitted to one or both of first and second memory array structures 106-1 and 106-2 directly.

Similar to those of the second staircase structure, stairs, in second staircase zone 128-2, of the same depths may be electrically coupled to the same string driver. In some implementations, a conductive (e.g., metal) line 119 may be employed to electrically connect (or in contact with) stairs of the same depth in second staircase zone 128-2. As shown in FIG. 1D, the number of conductive/dielectric portion pairs in bridge structure 125 may be equal to or greater than the total number of stairs in first staircase zone 128-1. In some implementations, in the y-direction, stairs in first staircase 132-1, third staircase 132-3, and fifth staircase 132-5 are aligned with each other, and stairs in second staircase 132-2, fourth staircase 132-4, and sixth staircase 132-6 are aligned with each other. In some implementations, first staircase 132-1, second staircase 132-2, third staircase 132-3, fourth staircase 132-4, fifth staircase 132-5, and sixth staircase 132-6 may have the same number of stairs.

Figure 4A:
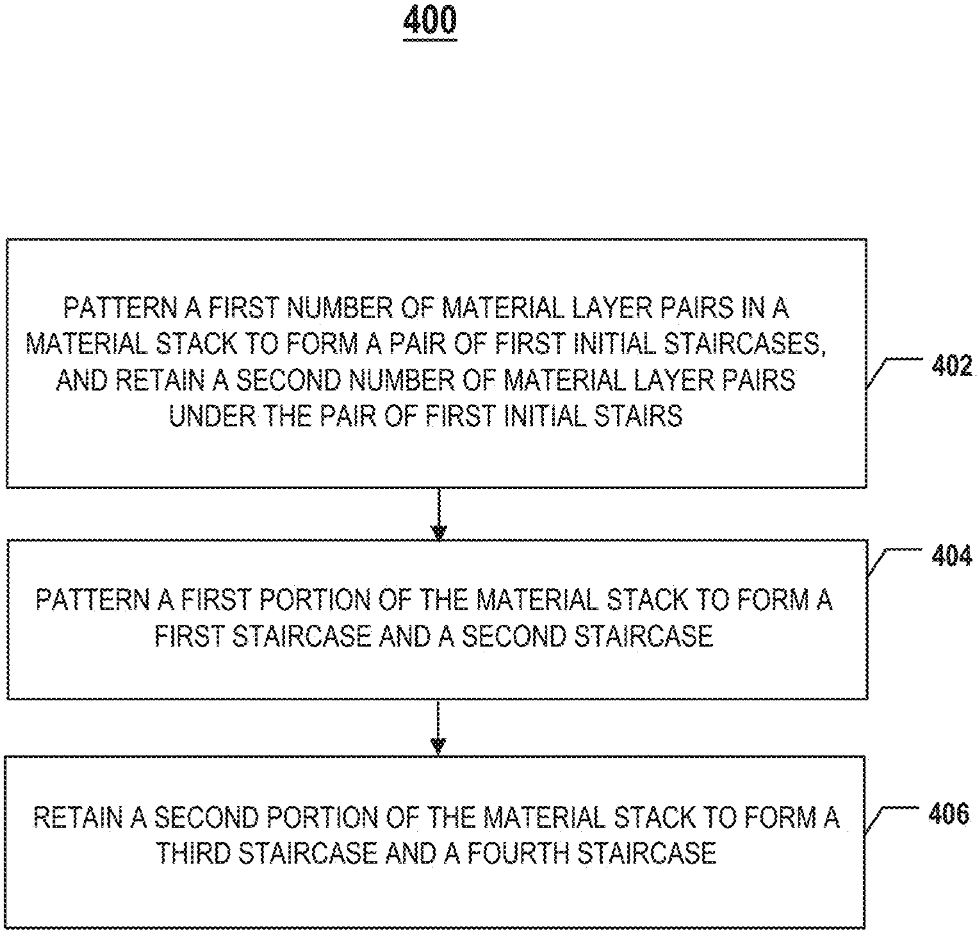
FIGS. 4A and 4B each illustrates a flowchart of an exemplary fabrication process, according to implementations of the present disclosure.

FIG. 4A is a flowchart of a method 400 for forming an exemplary staircase structure of a 3D memory device (e.g., the first staircase structure), according to some implementations. It is understood that the operations shown in method 400 are not exhaustive and that other operations can be performed as well before, after, or between any of the illustrated operations. Further, some of the operations may be performed simultaneously, or in a different order than shown in FIG. 4A. For ease of description, the first staircase structure (illustrated in FIGS. 1B and 1E) and method 400 are described together.

Figure 2A:
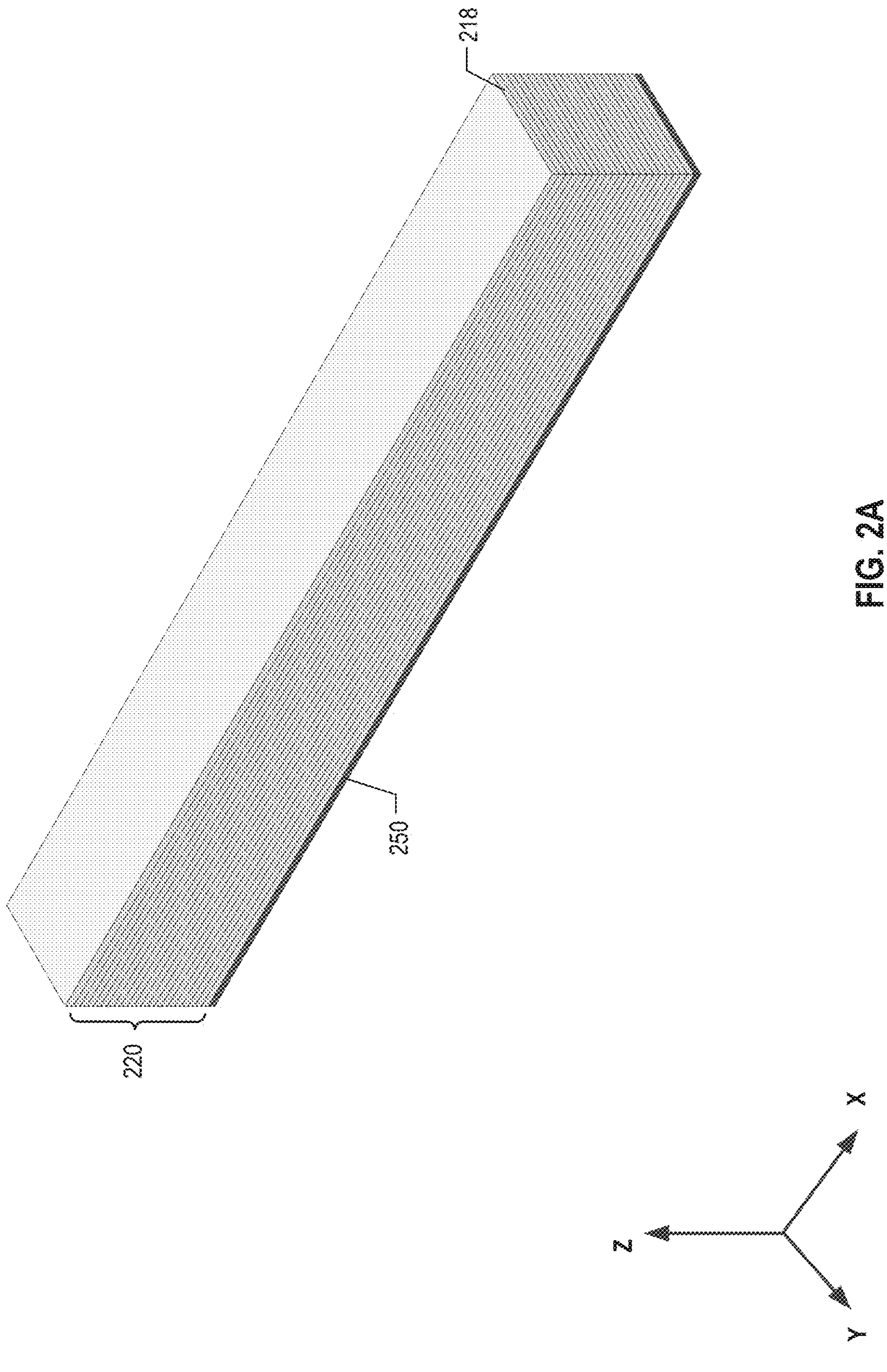
FIGS. 2A-2G illustrates an exemplary fabrication process to form a staircase structure, according to implementations of the present disclosure.
Figure 2B:
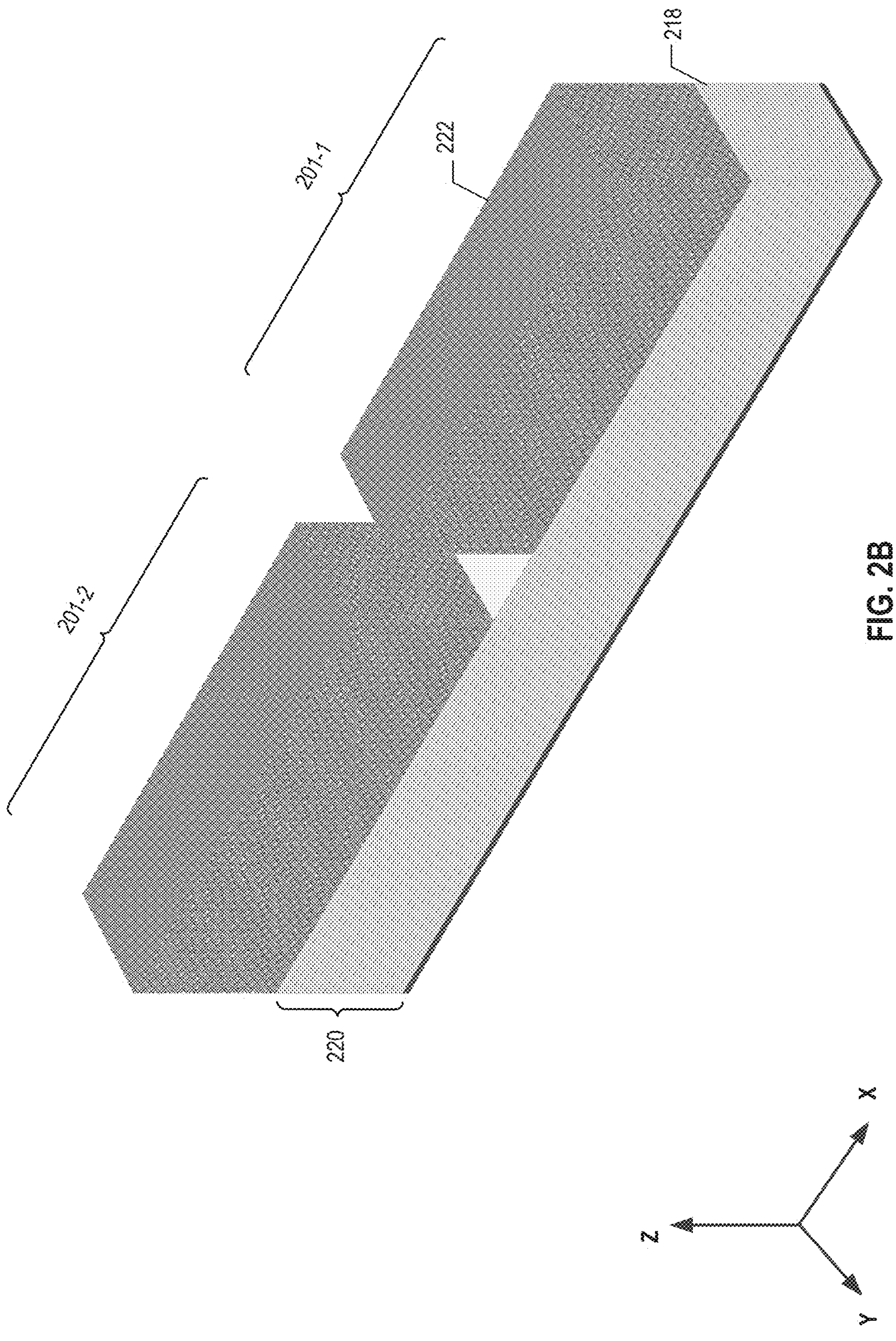
Figure 2C:
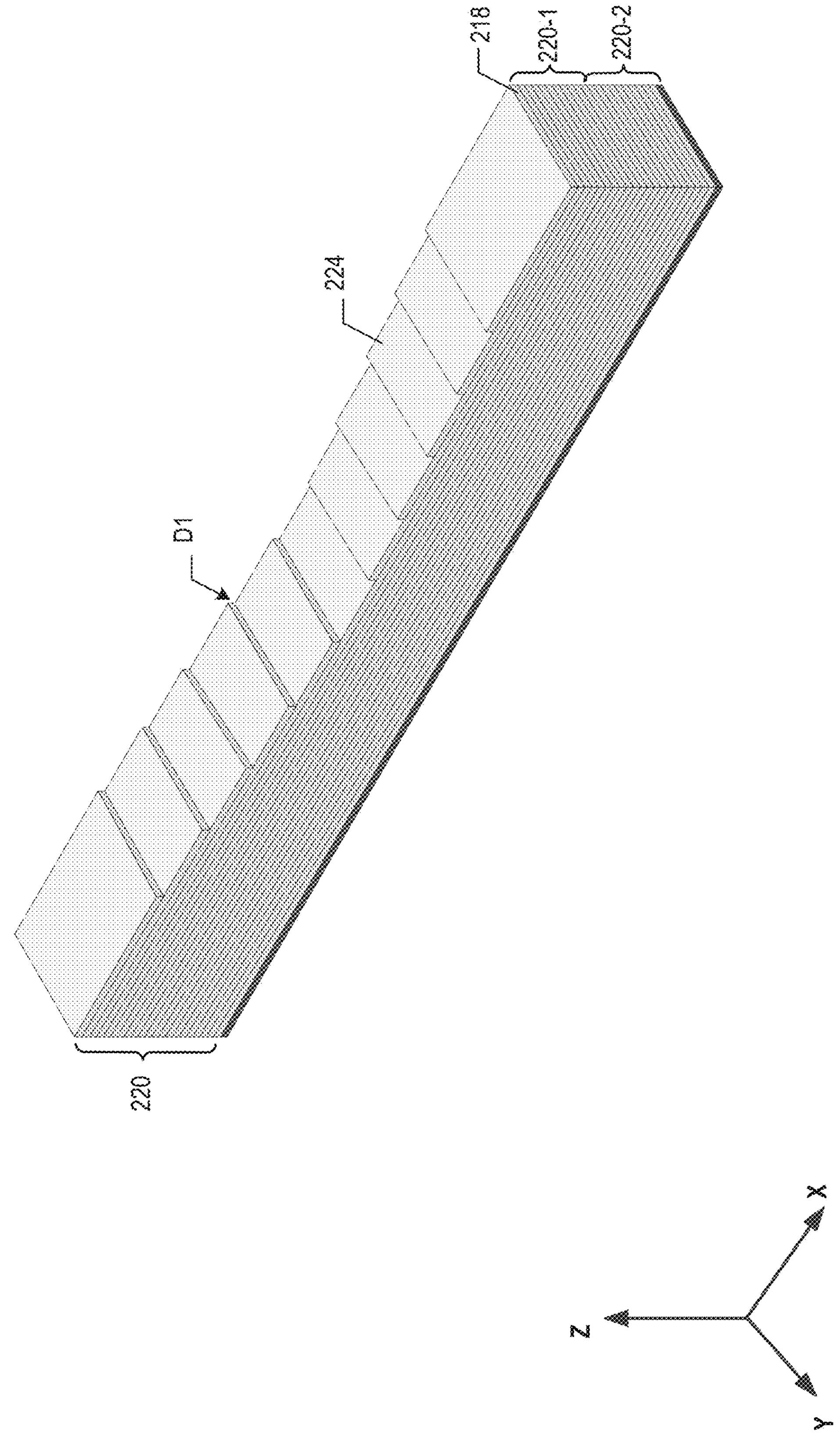

Referring to FIG. 4A, method 400 starts at operation 402, in which a first number of material layer pairs in a material stack is patterned to form a pair of first initial staircases, and a second number of material layer pairs is retained under the pair of first initial stairs. FIGS. 2A-2C illustrate corresponding structures.

As shown in FIG. 2A, a material stack 220 may be formed over substrate 250. Material stack 220 may include interleaved a plurality of first material layers and a plurality of second material layers, forming a plurality of material layer pairs 218 stacked along the z-direction. Each material layer pair 218 may include a first material layer and a second material layer, in contact with each other. In some implementations, the first material layers include a first dielectric material and function as sacrificial layers, and the second material layers include a second dielectric material different from the first dielectric material. For example, the first dielectric material may include silicon nitride, and the second dielectric material may include silicon oxide. In some implementations, the first material layers include a conductive material and function as conductive layers, and the second material layers include a dielectric material. For example, the conductive material may include polysilicon, and the dielectric material may include silicon oxide. Material layer pairs 218 may extend laterally in the x-direction and the y-direction. The deposition of material stack 220 may include one or more of chemical vapor deposition (CVD), physical vapor deposition (PVD), and atomic layered deposition (ALD).

As shown in FIG. 2B, a patterned photoresist (PR) layer 222 may be formed covering a first region 201-1 and a second region 201-2 of material stack 220. Referring back to FIGS. 1B and 1E, first region 201-1 may be the region in which first staircase 130-1 and third staircase 130-3 are formed, and second region 201-2 may be the region in which second staircase 130-2 and fourth staircase 130-4 are formed. The formation of patterned PR layer 222 may include photolithography.

As shown in FIG. 2C, a first number 220-1 of material layer pairs 218 in material stack 220 may be patterned to form a pair of first initial staircases 224, and a second number 220-2 of material layer pairs 218 is retained under the pair of first initial staircases 224. First number 220-1 of material layer pairs 218 may be at the upper portion of material stack 220, and second number of material layer pairs 218 may be at the lower portion of material stack 220. The sum of the first number and the second number may be less than or equal to the total number of material layer pairs 218 in material stack 220. First initial staircases 224 can be formed by repetitively patterning material stack 220 using patterned PR layer 222 as an etch mask. To form first initial staircases 224, patterned PR layer 222 is trimmed (e.g., etched incrementally and inwardly in the x-direction) and used as the etch mask for etching the exposed portion of material stack 220. The amount of trimmed PR can be directly related (e.g., determinant) to the dimensions of the stairs in first initial staircases 224. The trimming of patterned PR layer 222 can be obtained using a suitable etch, e.g., an isotropic dry etch and/or a wet etch. One or more PR layers can be formed and trimmed consecutively for the formation of first initial staircases 224. Each material layer pair 218 can be etched, after the trimming of patterned PR layer 222, using suitable etchants. The etching of material stack 220 may include a suitable dry etch and/or wet etch. The etched material layer pairs 218 may form a plurality of stairs of first initial staircases 224. The PR layer can then be removed. In some implementations, one material layer pair can form one level/stair such that stairs of first initial staircases 224 may each be defined by an edge of one material layer pair. The thickness of one material layer pair may be D1. The pair of first initial staircases 224 may be facing each other in the x-direction. Referring back to FIGS. 1B and 1E, a width, in they-direction, of first initial staircase 224 may each be equal to the total widths of first staircase zone 228-1 and second staircase zone 228-2.

Depending on the design of the 3D memory device, first number 220-1 of material layer pairs 218 may be patterned to form the stairs of first initial staircases 224. In some implementations, to form the first staircase shown in FIGS. 1B and 1E, first number 220-1 is equal to the number of stairs in each staircase, and the pair of first initial staircases 224 may have the same number of stairs. In some implementations, the pair of first initial staircases 224 may have different numbers of stairs. Second number 220-2 of material layer pairs 218 may be retained (e.g., unetched) under first initial staircases 224.

Referring back to FIG. 4A, method 400 proceeds to operation 404, in which a first portion of the material stack, in a first staircase zone, is patterned to form a first staircase and a second staircase. FIGS. 2D-2G illustrate corresponding structures.

Figure 2D:
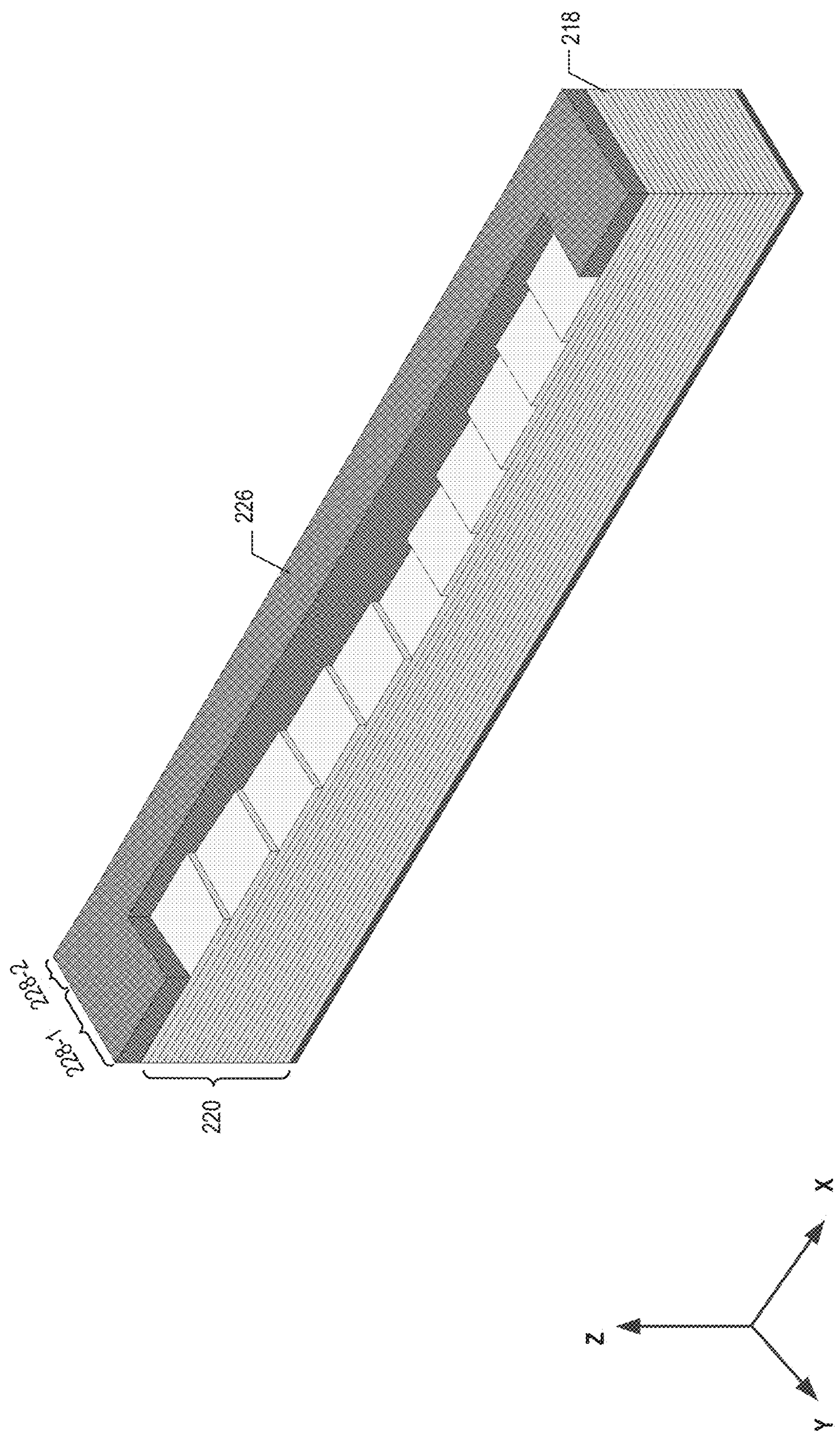

As shown in FIG. 2D, a patterned PR layer 226 may be formed covering a second staircase zone 228-2. A first staircase zone 228-1 may be exposed. First staircase zone 228-1 may be the area in which the first and second staircases (e.g., 130-1, 130-2) are formed, and second staircase zone 228-2 may be the area in which the third and fourth staircases (e.g., 130-3, 130-4) are formed, referring back to the description of first and second staircase zones 128-1 and 128-2. In some implementations, other parts of material stack 220 may also be covered to avoid etching. The formation of patterned PR layer 226 may include photolithography.

Figure 2E:
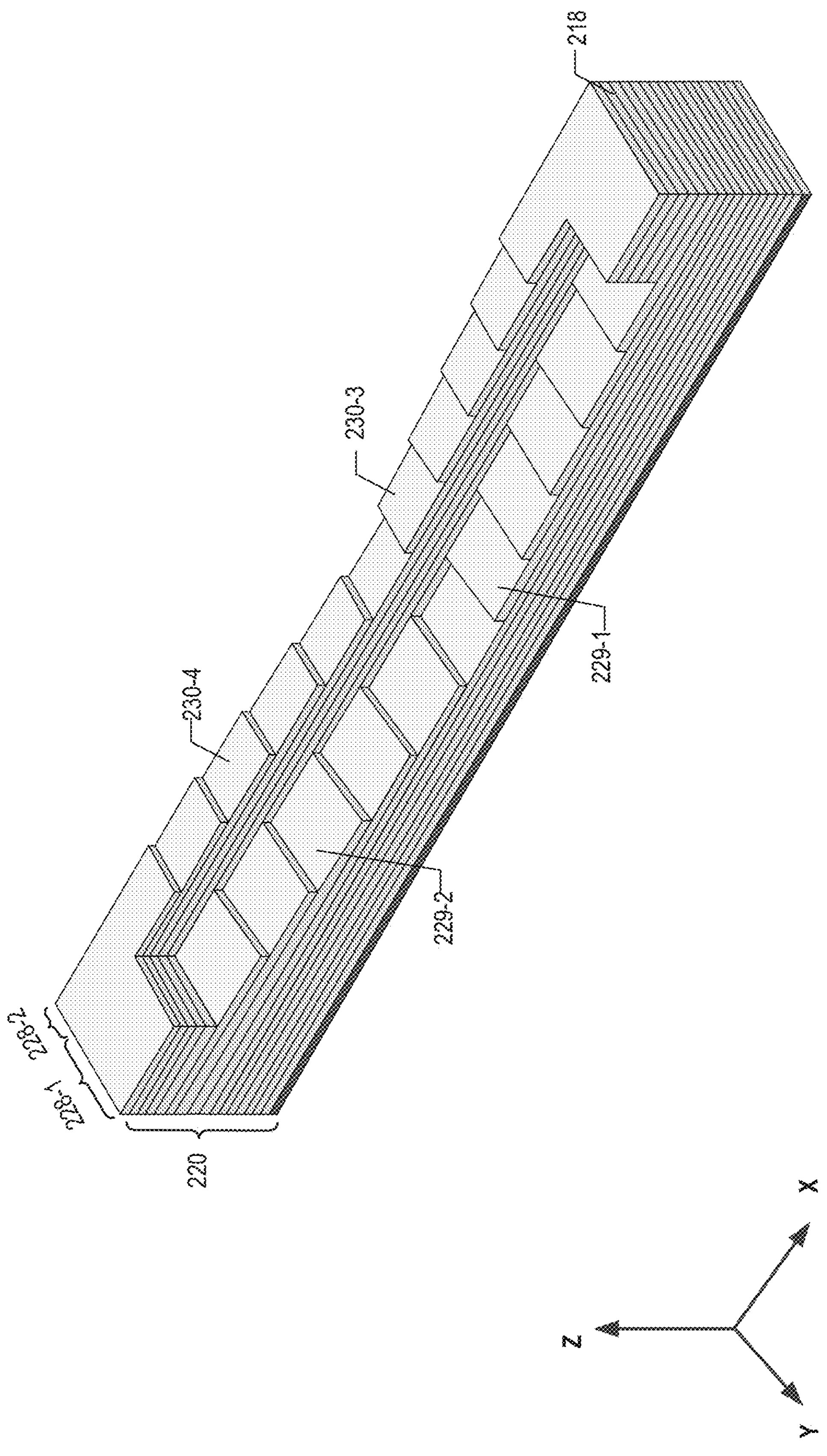

As shown in FIG. 2E, the portion of material stack 220, exposed by patterned PR layer 226, may be vertically etched by at least the total depth of first initial staircases 224. A pair of second initial staircases 229-1 and 229-2 may be formed facing each other in the x-direction. In some implementations, the highest stair of second initial staircases 229-1 and 229-2 may be lower than the lowest stair or surface in second staircase zone 228-2. The formation of second initial staircases 229-1 and 229-2 may include a suitable etching process such as wet etch and/or dry etch. Patterned PR layer 226 may then be removed.

Figure 2F:
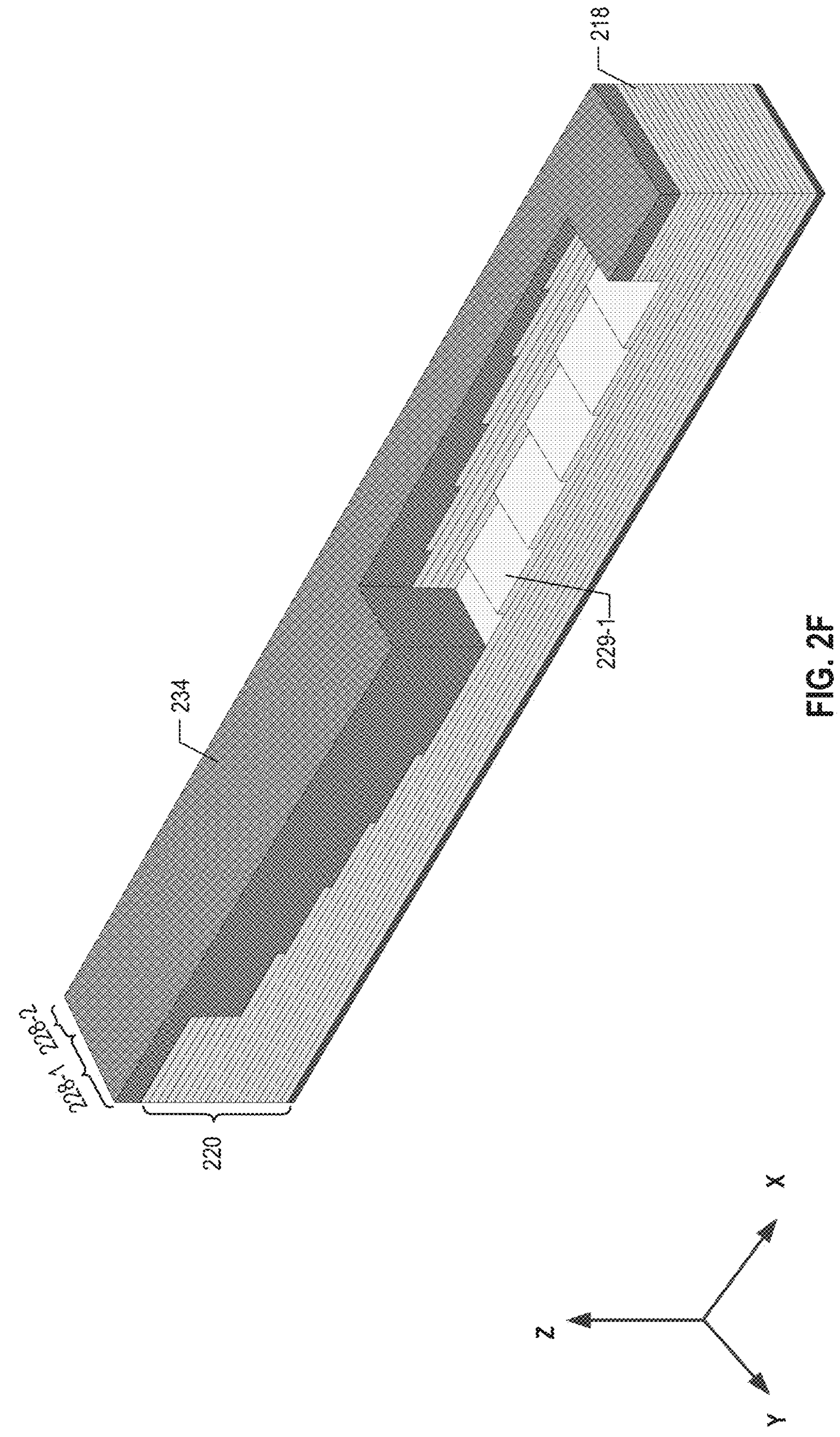

As shown in FIG. 2F, a patterned PR layer 234 may be formed covering a first portion of material stack 220, i.e., second staircase zone 228-2 and one of second initial staircases 229-2, retaining the other one of second initial staircases 229-1 exposed. The formation of patterned PR layer 234 may include photolithography.

Figure 2G:
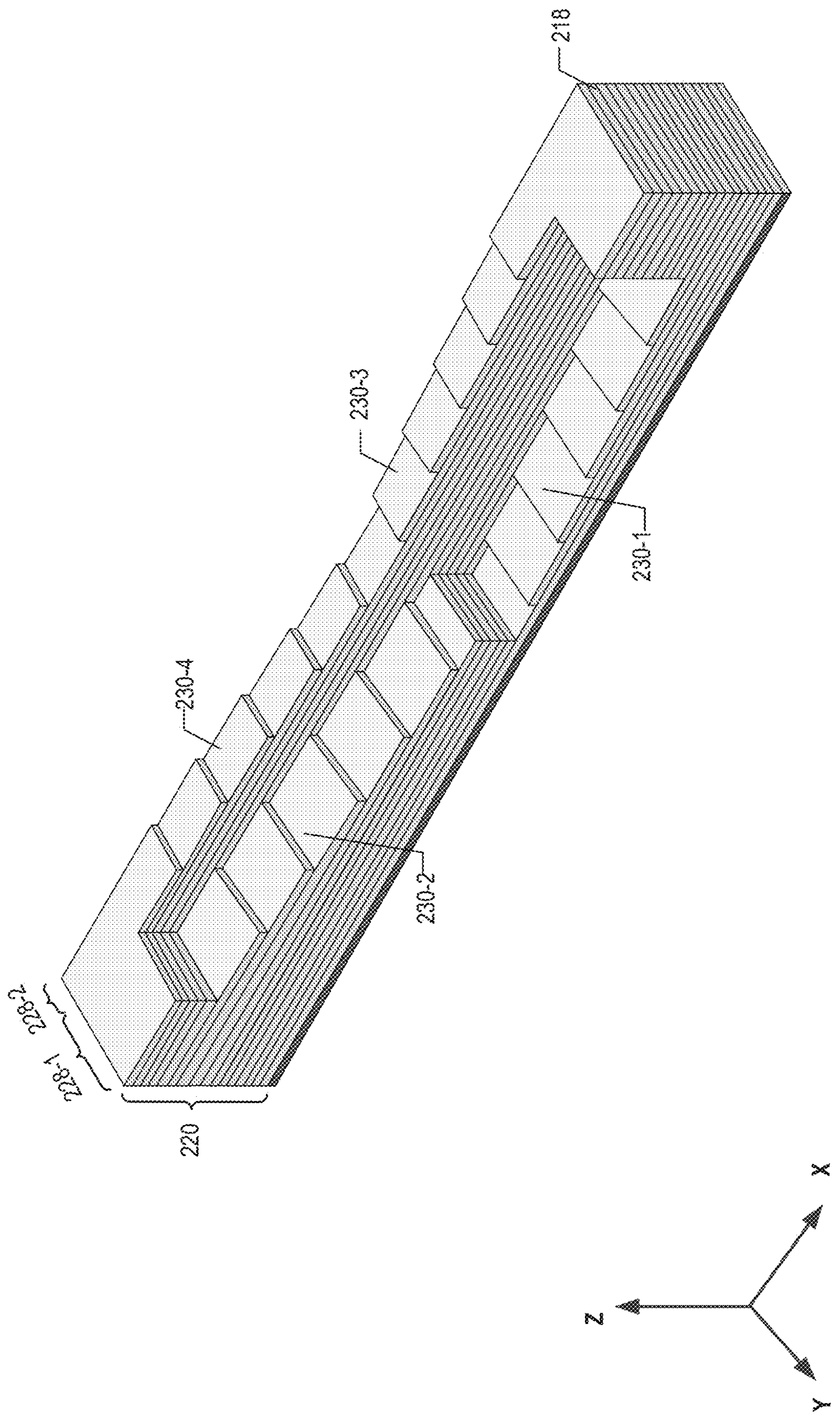

As shown in FIG. 2G, second initial staircase 229-1 may be vertically etched by a depth of at least the total depth of second initial staircase 229-2 (e.g., the same as the total depth of second initial staircase 229-1), such that the lowest stair of second initial staircase 229-2 is higher than the highest stair of the etched second initial staircase 229-1 by at least D1. The etched second initial staircase 229-1 may form a first staircase 230-1, and the unetched second initial staircase 229-2 may form a second staircase 230-2.

Referring back to FIG. 4A, method 400 proceeds to operation 406, in which a second portion of the material stack is retained to form a third staircase and a fourth staircase. FIGS. 2F and 2G illustrate corresponding structures.

As shown in FIG. 2F, a second portion of material stack 220, second staircase zone 228-2 and second initial staircases 229-2 is retained. The retained second initial staircase 229-2 may form a second staircase (e.g., 130-2). The retained portion of first initial staircases 224, e.g., in second staircase zone 228-2, may form a third staircase 230-3 and a fourth staircase 230-4. The retaining second number 220-2 of material layer pairs 218 under third and fourth staircases 230-3 and 230-4, e.g., also coupled to first and second staircases 230-1 and 230-2, may form an initial bridge structure (referring back to bridge structure 121). Patterned PR layer 234 may then be removed.

Figure 4B:
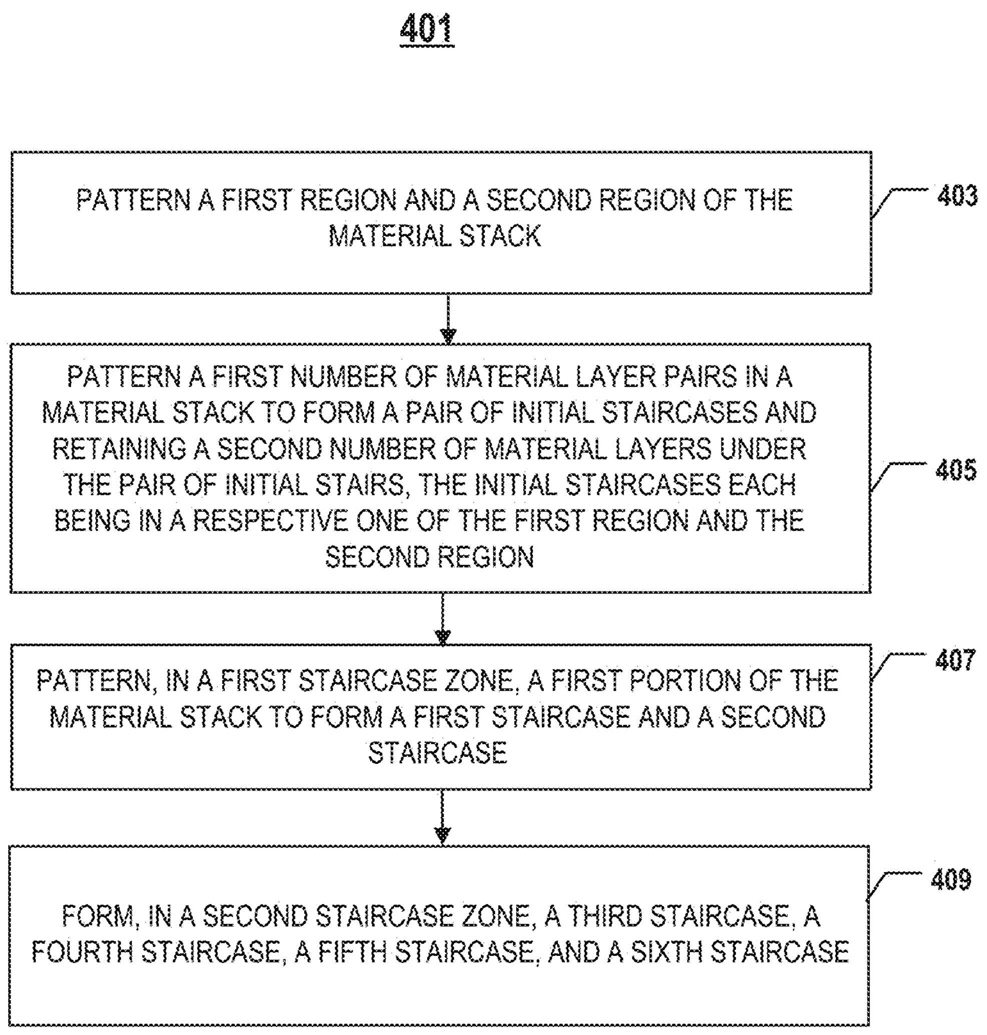

FIG. 4B is a flowchart of a method 401 for forming another exemplary staircase structure of a 3D memory device (e.g., the second staircase structure), according to some implementations. It is understood that the operations shown in method 401 are not exhaustive and that other operations can be performed as well before, after, or between any of the illustrated operations. Further, some of the operations may be performed simultaneously, or in a different order than shown in FIG. 4B. For ease of description, the second staircase structure (illustrated in 1C and 1F) and method 401 are described together.

Figure 3A:
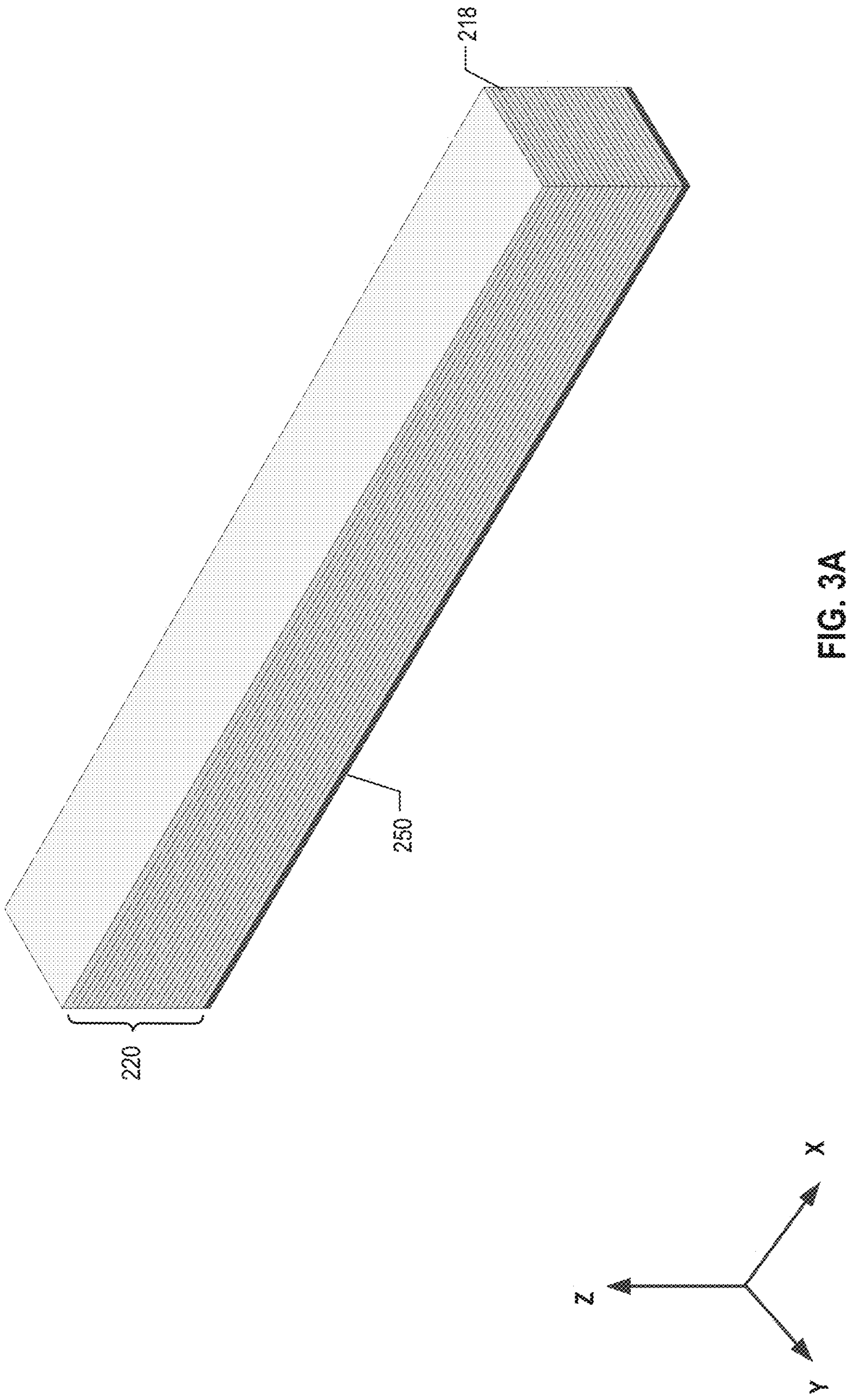
FIGS. 3A-3G illustrates an exemplary fabrication process to form another staircase structure, according to implementations of the present disclosure.
Figure 3B:
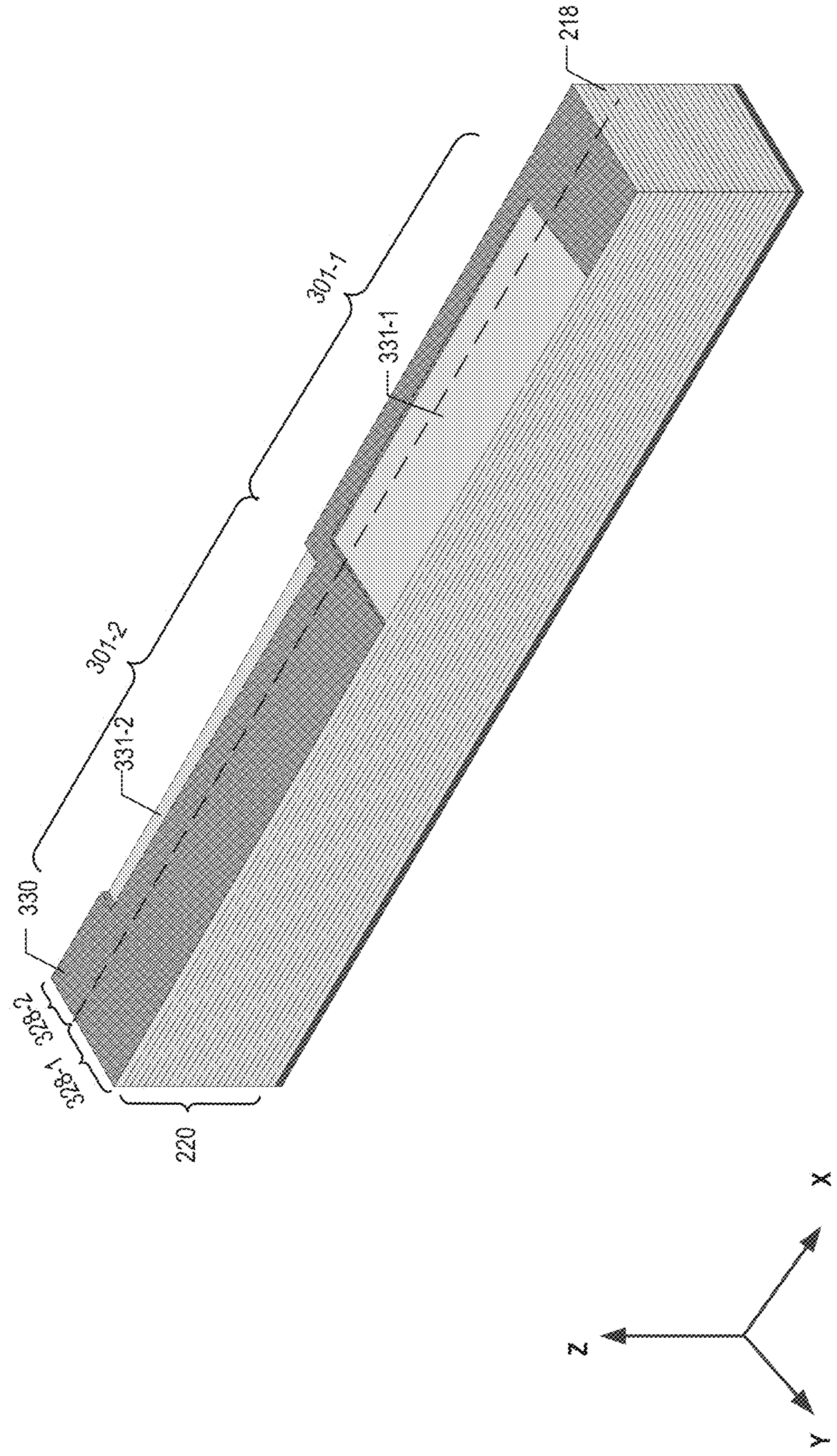

Referring to FIG. 4B, method 401 starts at operation 403, in which a first region and a second region of a material stack are patterned. FIGS. 3A and 3B illustrate corresponding structures.

As shown in FIG. 3A, a material stack 220 may be formed over substrate 250. Material stack 220 may include a plurality of material layer pairs 218 stacked on substrate 250. Detailed description of material stack 220 may be referred to that of FIG. 2A and is not repeated herein.

As shown in FIG. 3B, material stack 220 may be divided into a first region 301-1 and a second region 301-2 in the x-direction. First region 301-1 and second region 301-2 may be aligned in the x-direction. Referring back to FIGS. 1C and 1F, first staircase 131-1, third staircase 131-3, and fifth staircase 131-5 may be formed in first region 301-1; and second staircase 131-2, fourth staircase 131-4, and sixth staircase 131-6 may be formed in second region 301-2.

As shown in FIG. 3B, a patterned PR layer 330 may be formed over first region 301-1 and 301-2 of material stack 220. Patterned PR layer 330 may expose a first area 331-1 in first region 301-1 and expose a second area 331-2 in second region 301-2. First area 331-1 may cover the area in which first staircase 131-1 and fifth staircase 131-5 are formed. In some implementations, a width of first area 331-1, in the y-direction, may be greater than that of first staircase zone 328-1. Second area 331-2 may cover the area in which sixth staircase 131-6 is formed. In some implementations, a width of second area 331-2, in the y-direction, may be less than that of second staircase zone 328-2. The formation of patterned PR layer 330 may include photolithography.

Figure 3C:
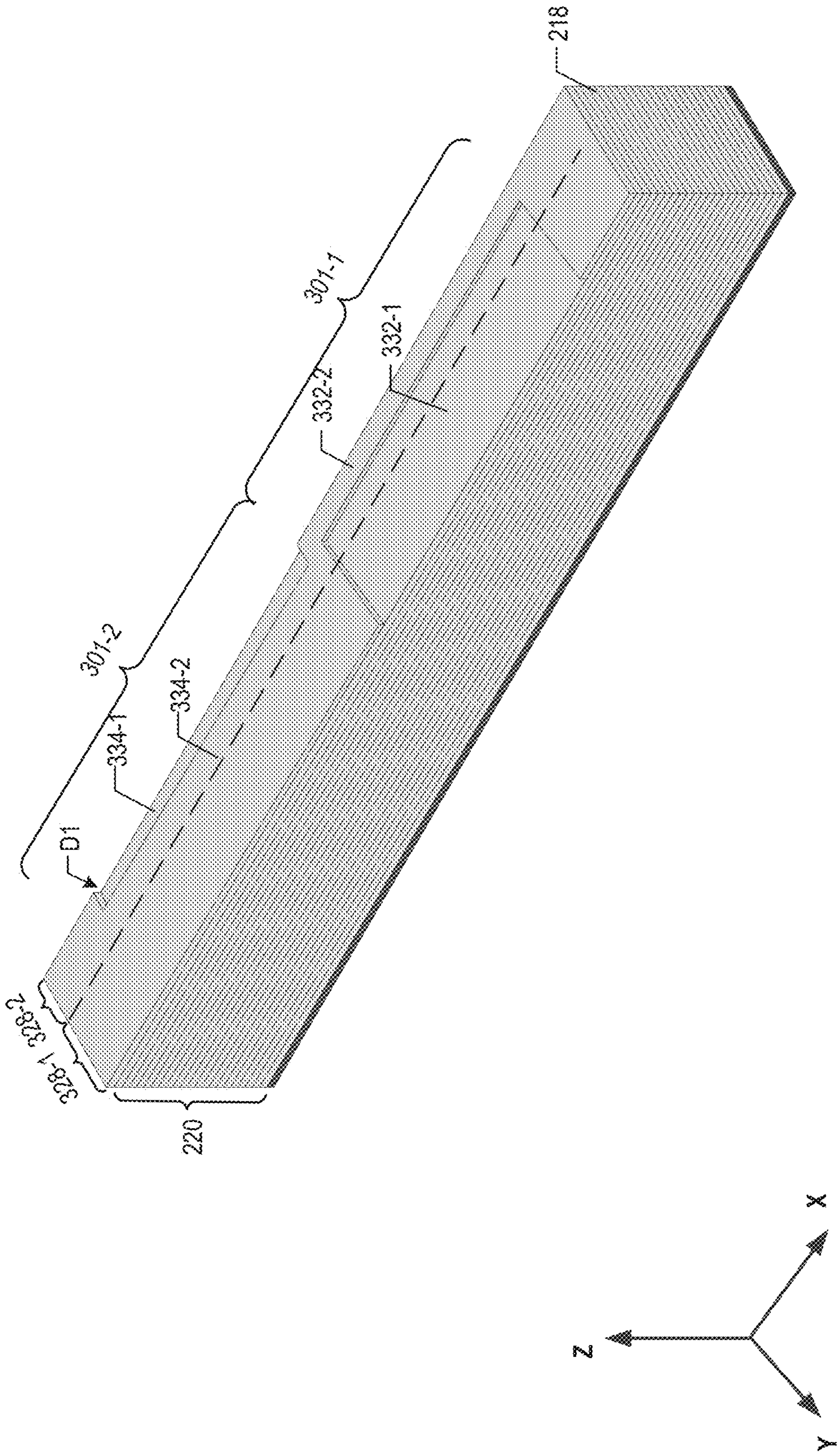

As shown in FIG. 3C, an etched portion and retained portion of material stack 220 may be respectively formed in first region 301-1 and second region 301-2. Using patterned PR layer 330 as an etch mask, first area 331-1 and second area 331-2 of material stack 220 may each be etched by a depth of D1, i.e., the depth of one material layer pair 218. An etched portion 332-1 and a retained portion 332-2 may be formed in first region 301-1, and an etched portion 334-1 and a retained portion 334-2 may be formed in second region 301-2. In some implementations, etched portion 332-1 and retained portion 334-2 may be aligned with each other in the x-direction, and etched portion 334-1 and retained portion 332-2 may be aligned with each other in the x-direction. In other words, the boundary between etched portion 332-1 and retained portion 332-2 is aligned with the boundary between etched portion 334-1 and retained portion 334-2 in the x-direction. The etching of material stack 220 may include a suitable dry etch and/or wet etch. Patterned PR layer 330 may then be removed.

Figure 3D:
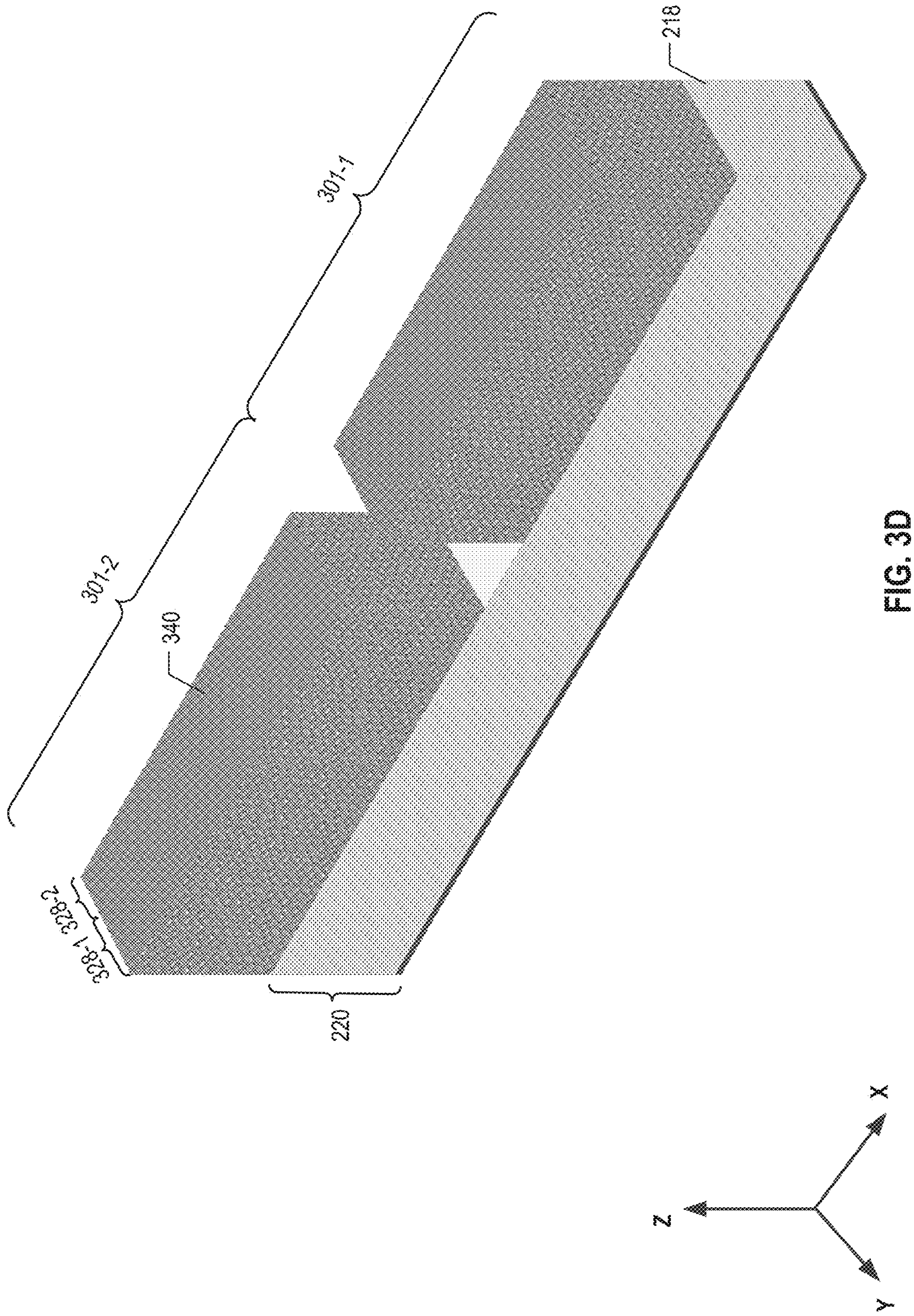
Figure 3E:
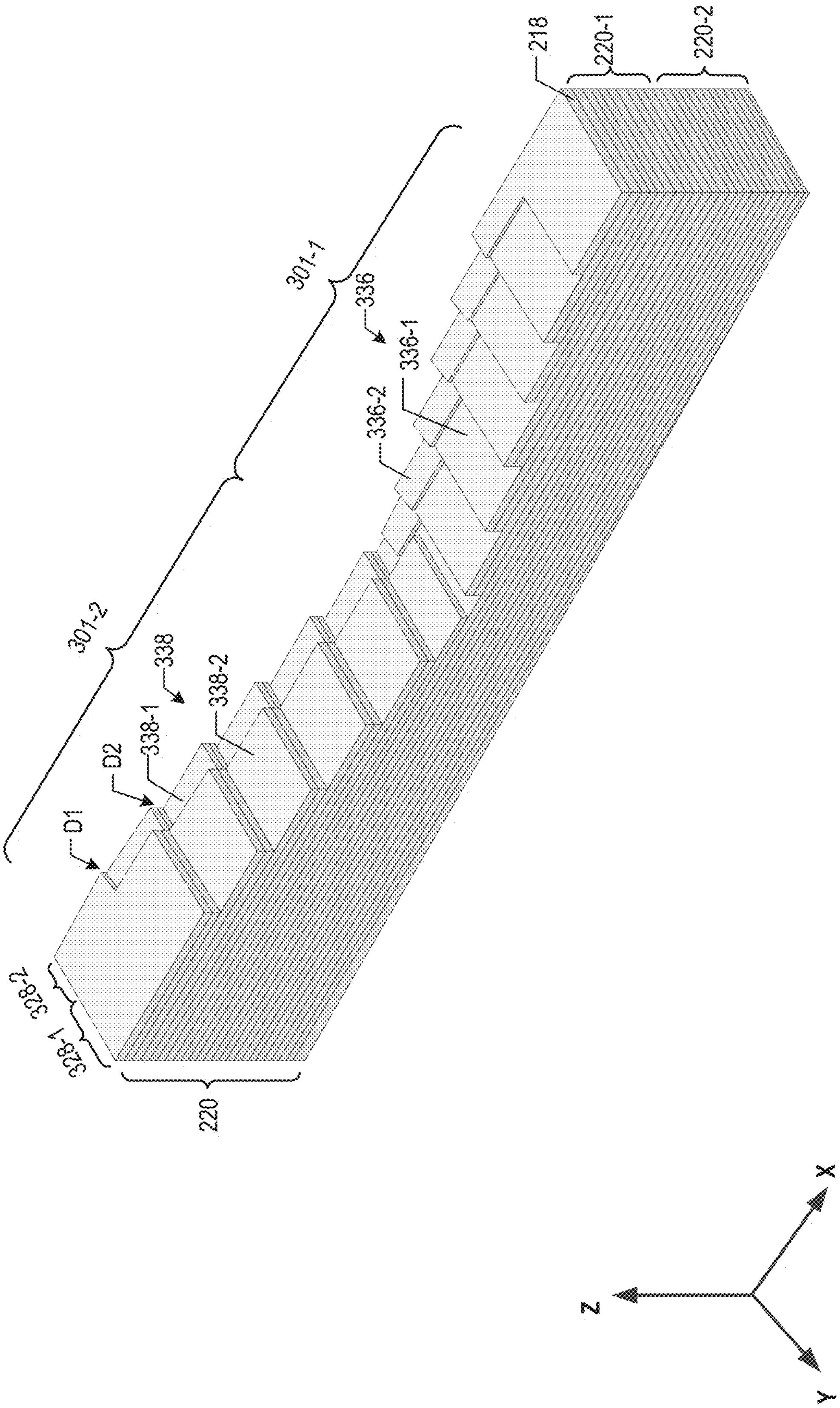

Referring back FIG. 4B, method 401 proceeds to operation 405, in which a first number of material layer pairs in the material stack is patterned to form a pair of initial staircases and a second number of material layers under the pair of first initial stairs is retained. The initial staircases are each in a respective one of the first region and the second region. FIGS. 3D and 3E illustrate corresponding structures.

As shown in FIG. 3D, a patterned PR layer 340 may be formed covering first region 301-1 and a second region 301-2 of material stack 220. Referring back to FIGS. 1C and 1F, first region 301-1 may be the region in which first staircase 131-1, third staircase 131-3, and fifth staircase 131-5 are formed, and second region 301-2 may be the region in which second staircase 131-2, fourth staircase 131-4, and sixth staircase 131-6 are formed. The formation of patterned PR layer 340 may include photolithography.

As shown in FIG. 3E, a first number 220-1 of material layer pairs 218 in material stack 220 may be patterned to form a pair of initial staircases 336 and 338, and a second number 220-2 of material layer pairs 218 is retained under the pair of initial staircases 336 and 338. First number 220-1 of material layer pairs 218 may be at the upper portion of material stack 220, and second number of material layer pairs 218 may be at the lower portion of material stack 220. The sum of the first number and the second number may be less than or equal to the total number of material layer pairs 218 in material stack 220. In some implementations, initial staircase 336 is formed in first region 301-1, and initial staircase 338 is formed in second region 301-2. Initial staircases 336 and 338 can be formed by repetitively patterning material stack 220 using patterned PR layer 340 as an etch mask. The etching of material stack 220 may be referred to the description of FIG. 2C, and the detailed description is not repeated herein. The etching of material stack 220 may transfer the pattern/thickness difference between etched portions (e.g., 332-1, 334-1) and retained portions (e.g., 332-2, 334-2) to the formed stairs. The etched material layer pairs 218 may form a plurality of stairs of initial staircases 336 and 338. In some implementations, two material layer pairs can form one level/stair such that stairs of initial staircases 336 and 338 may each be defined by an edge of two material layer pairs. The thickness of two material layer pairs may be D2. The pair of initial staircases 336 and 338 may be facing each other in the x-direction. Referring back to FIGS. 1C and 1F, a width, in the y-direction, of initial staircases 336 and 338 may each be equal to the total widths of first staircase zone 328-1 and second staircase zone 328-2.

As shown in FIG. 3E, each stair of initial staircases 336 and 338 may include a first division and a second division, aligned with each other in they-direction. For example, each stair of initial staircase 336 may include a first division 336-1 and a second division 336-2. First division 336-1 may be formed from the etched portion 332-1 of material stack 220, and second division 336-2 may be formed from the retained portion 332-2 of material stack 220. In other words, for the same stair, first division 336-1 is lower than second division 336-2 by a depth of D1. First division 336-1 and second division 336-2 may be formed by the pattern transfer of etched portion 332-1 and retained portion 332-2. Similarly, each stair of initial staircase 338 may include a first division 338-1 and a second division 338-2, formed respectively from etched portion 334-1 and retained portion 334-2. Referring back to the description of FIG. 3C, each first division 336-1 of a stair may have the same depth as first division 338-1 of a respective stair, and each second division 336-2 of a stair may have the same depth as second division 338-2 of a respective stair. In some implementations, first divisions 336-1 and 338-1 of the highest stairs in initial staircases 336 and 338 have the same depth, and second divisions 336-2 and 338-2 of the highest stairs in initial staircases 336 and 338 have the same depth.

Figure 3F:
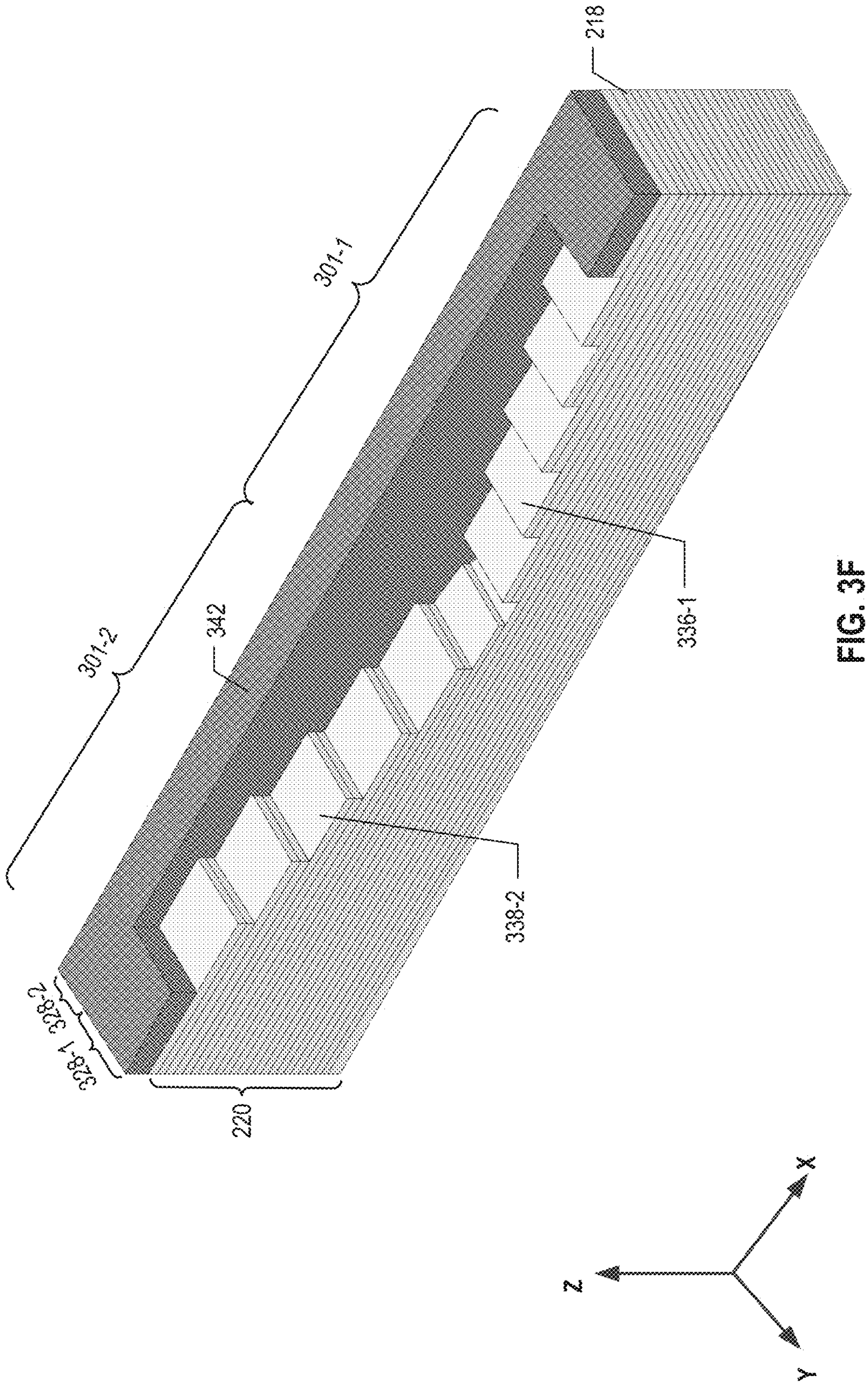
Figure 3G:
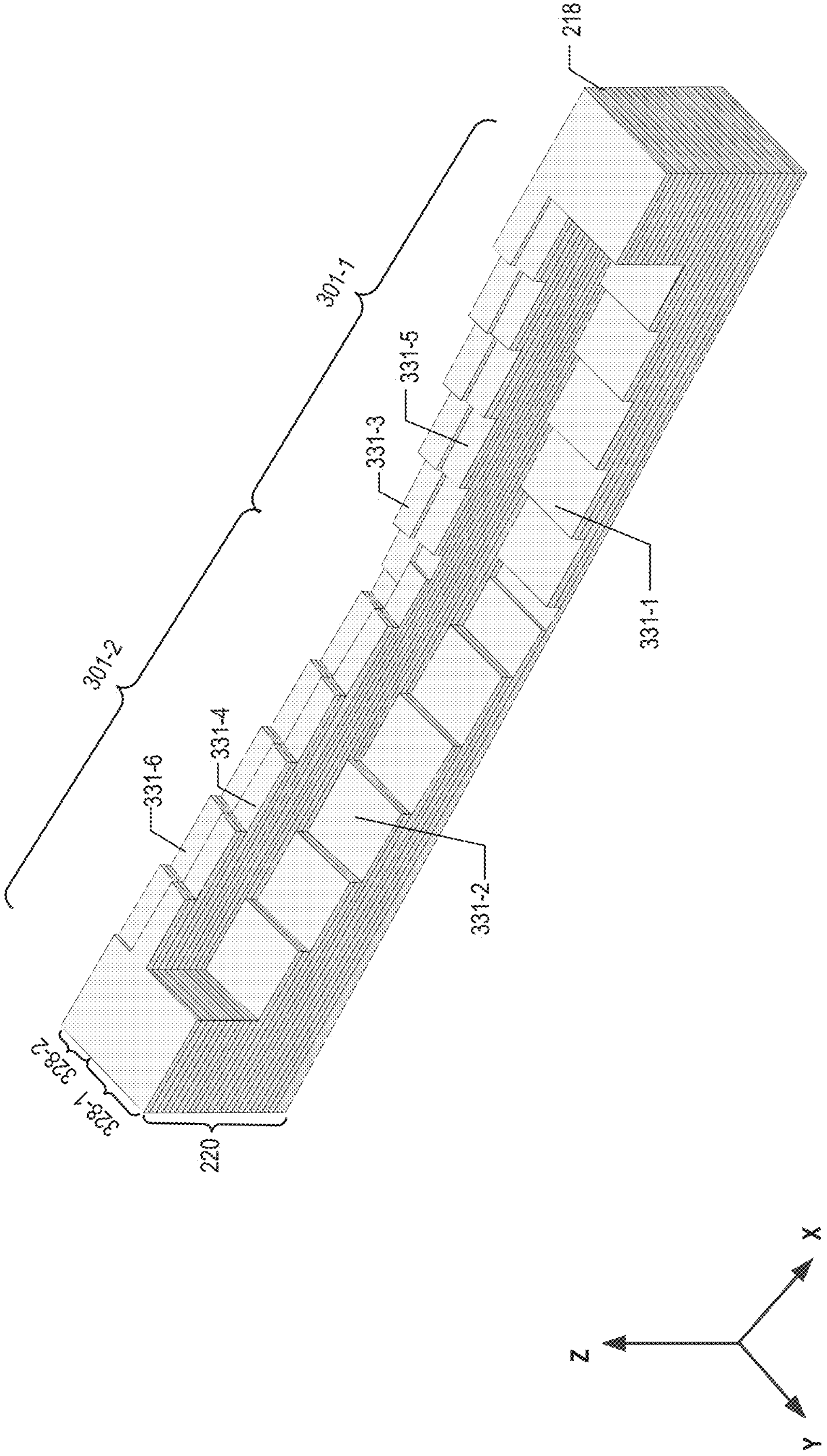

Referring back to FIG. 4B, method 401 proceeds to operation 407, in which a first portion of the material stack, in the first staircase zone, is patterned to form a first staircase and a second staircase. FIGS. 3F and 3G illustrate corresponding structures.

As shown in FIG. 3F, a patterned PR layer 342 may be formed covering a second staircase zone 328-2. A first staircase zone 328-1 may be exposed. First staircase zone 328-1 may be the area in which the first and second staircases (e.g., 131-1, 131-2) are formed, and second staircase zone 328-2 may be the area in which the third, fourth, fifth, and sixth staircases (e.g., 131-3, 131-4, 131-5, 131-6) are formed, referring back to the description of first and second staircase zones 128-1 and 128-2. In some implementations, other parts of material stack 220 may also be covered to avoid etching. The formation of patterned PR layer 342 may include photolithography.

As shown in FIG. 3G, a first portion of material stack 220 (e.g., part of initial staircase 336 and initial staircase 338 in first staircase zone 328-1), exposed by patterned PR layer 342, may be vertically etched by a depth of at least the total depth of initial staircases 336 or 338. The first portion of material stack 220 may include part of first divisions 336-1 of initial staircase 336 and part of second divisions 338-2 of initial staircase 338. The part of initial staircase 336 in first staircase zone 328-1 may be etched to form a first staircase 331-1, and the part of initial staircase 338 in first staircase zone 328-1 may be etched to form a second staircase 331-2. First staircase 331-1 and second staircase 331-2 may be facing each other in the x-direction. In some implementations, the highest stair of second staircase 331-2 may be higher than the highest stair of first staircase 331-1 by a depth of D1. The highest stair of second staircase 331-2 may be lower than the lowest stairs in second staircase zone 328-2. The formation of first and second staircases 331-1 and 331-2 may include a suitable etching process such as wet etch and/or dry etch. Patterned PR layer 342 may then be removed.

Referring back to FIG. 4B, method 401 proceeds to operation 409, in which a third staircase, a fourth staircase, a fifth staircase, and a sixth staircase are formed in the second staircase zone. FIG. 3G illustrates a corresponding structure.

As shown in FIG. 3G, in first region 301-1, second divisions 336-2 of initial staircase 336 may form a third staircase 331-3, and the rest of first divisions 336-1 in second staircase zone 328-2 may form a fifth staircase 331-5. In second region 301-2, the rest of second divisions 338-2 of initial staircase 338 in second staircase zone 328-2 may form a fourth staircase 331-4, and first divisions 338-1 may form a sixth staircase 331-6. In some implementations, third staircase 331-3 and sixth staircase 331-6 may be facing each other in the x-direction, and fourth staircase 331-4 and fifth staircase 331-5 may be facing each other in the x-direction. The retaining second number 220-2 of material layer pairs 218 under third, fourth, fifth, and sixth staircases 331-3, 331-4, 331-5, and 331-6 e.g., also coupled to first and second staircases 331-1 and 331-2-2, may form an initial bridge structure (referring back to bridge structure 123).

In some implementations, to form the third staircase structure shown in FIGS. 1D and 1G, a method similar to method 401 may be used. An etched portion and a retained portion of material stack 220 may be respectively formed in first region 301-1 and second region 301-2. Different from method 401, in some implementations, the etched portions in first region 301-1 second region 301-2 may be aligned with each other in the x-direction, and the retained portions in first region 301-1 and second region 301-2 may be aligned with each other in the x-direction. In other words, the boundary between the etched portion and the retained portion in first region 301-1 is aligned with the boundary between the etched portion and the retained portion in second region 301-2 in the x-direction. The width of each etched portion, in they-direction, may be less than that of second staircase zone 328-2, and the width of each retained portion, in the y-direction, may be greater than that of first staircase zone 328-1.

Material stack 220 may be patterned to form a pair of initial staircases using a process similar to that illustrated in FIGS. 3D and 3E, and the first portion of material stack 220 in first staircase zone 328-1 may be etched down, forming a first staircase and a second staircase using a process similar to that illustrated in FIGS. 3F and 3G. The retained portions of the initial staircases in first staircase zone 328-1 may form a third staircase in first region 301-1, and a fourth staircase in second region 301-2. The etched portions of the initial staircases in first staircase zone 328-1 may form a fifth staircase in first region 301-1, and a sixth staircase in second region 301-2. The third staircase may face the fourth staircase in the x-direction, and the fifth staircase may face the sixth staircase in the x-direction. The retaining material layer pairs 218 under the third, fourth, fifth, and sixth staircases, e.g., also electrically coupled to the first and second staircases, may form an initial bridge structure (referring back to bridge structure 125).

In some implementations, to form the staircase structures (e.g., the first staircase, the second staircase, and the third staircase), a plurality conductive layers are formed in the staircases and initial bridges. In some implementations, if material layer pair 218 includes a sacrificial layer and a dielectric layer, a gate-replacement process may be performed to form the conductive layers in replacement of the sacrificial layers. In some implementations, an isotropic etching process may be performed, through the slit structures (e.g., 108), to remove the sacrificial layers in the initial bridges, the staircases, and the rest of material stack 220 to form a plurality of lateral recesses. A suitable conductor material, e.g., W, may be deposited to fill the lateral recesses to form the conductive layers. A pair of memory array structures may be formed in the core regions of the 3D memory device. Bridge structures may be formed from initial bridge structures, located in the staircase region and conductively connected to the memory array structures and some of the staircases. The staircases may include a plurality of conductive layers and may be conductively connected to the memory array structures. A source contact structure can be formed in the slit structure. The source contact structure may include an insulating spacer and a source contact in the insulating spacer. The conductor material, the insulating spacer, and the source contact may each be deposited by a suitable deposition method such as CVD, ALD, PVD, or a combination thereof. In some implementations, a plurality of channel structures are formed in the memory array structures. The channel structures may intersect with the conductive layers, forming a plurality of memory cells. The formation of the channel structures includes a suitable deposition method such as CVD, ALD, PVD, or a combination thereof.

In some implementations, a plurality of conductive vias, e.g., word line contacts, are formed to be each in contact with a respective stair, in the first staircase zone and the second staircase zone. Stairs electrically coupled to the same conductive layer may be electrically connected by a conductive (e.g., metal) line in contact with the conductive vias on the stairs. In some implementations, an insulator structure is formed over the staircases and the conductive vias are formed in the insulator structure. The staircases may be positioned in the insulator structure. In some implementations, the insulator structure includes silicon oxide, and the deposition of the insulator structure includes CVD, PVD, ALD, or a combination thereof. The conductive vias and conductive lines may be formed by patterning the insulator structure to form a plurality of openings. A suitable conductive material may be deposited to fill the openings. In some implementations, the patterning of the insulator structure includes a suitable dry etch and/or wet etch. In some implementations, the conductive vias and conductive lines include W, and the deposition of the conductive vias and conductive lines includes CVD, PVD, ALD, or a combination thereof.

It should be noted that, the structures and methods disclosed herein should not be limited by the implementations of the present disclosure. In some implementations, more staircase structures (e.g., divisions) can be formed over the bridge structure, based on the design of the 3D memory device. In some implementations, more staircases are formed on the bridge structure as more conductive/dielectric layer pairs are formed in the memory array structures.

Figure 5:
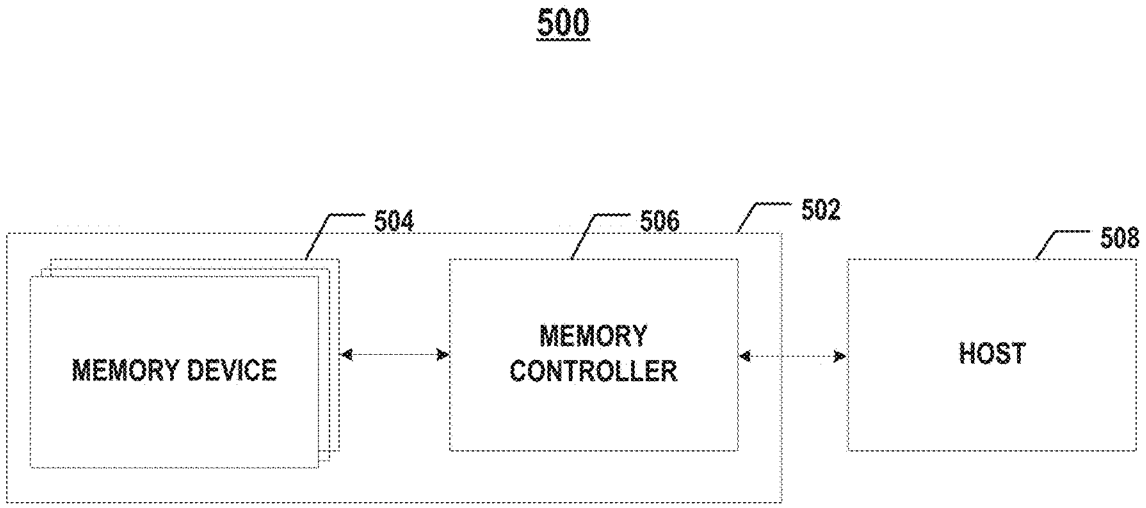
FIG. 5 illustrates a block diagram of an exemplary system having a memory device, according to some aspects of the present disclosure.

FIG. 5 illustrates a block diagram of an exemplary system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive data to or from memory devices 504.

Memory device 504 can be any memory device disclosed in the present disclosure. As disclosed above in detail, memory device 504, such as a NAND Flash memory device, may have a bridge structure and a plurality of staircases on the bridge structure. Memory device 504 may also have staircases adjacent to and electrically coupled to the bridge structure. Memory controller 506 is coupled to memory device 504 and host 508 and is configured to control memory device 504, according to some implementations. Memory controller 506 can manage the data stored in memory device 504 and communicate with host 508. For example, memory controller 506 may be coupled to memory device 504, such as any 3D memory devices described herein, and memory controller 506 may be configured to control operations of the channel structures in any one of the 3D memory devices of the present disclosure such as the application of word line voltages on the landing structures and the conductive materials.

In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of memory device 504, such as read, erase, and program operations. Memory controller 506 can also be configured to manage various functions with respect to the data stored or to be stored in memory device 504 including, but not limited to bad-block management, garbage collection, logical-to-physical address conversion, wear leveling, etc. In some implementations, memory controller 506 is further configured to process error correction codes (ECCs) with respect to the data read from or written to memory device 504. Any other suitable functions may be performed by memory controller 506 as well, for example, formatting memory device 504. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 6A:
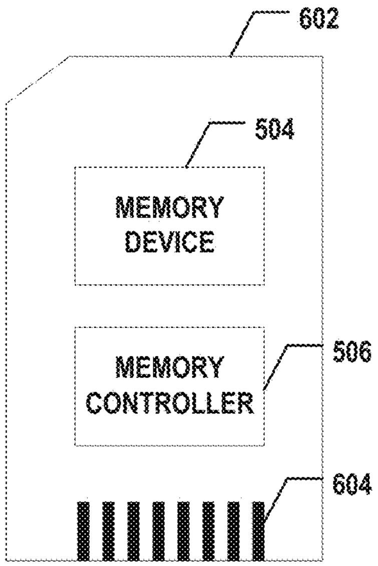
FIG. 6A illustrates a diagram of an exemplary memory card having a memory device, according to some aspects of the present disclosure.
Figure 6B:
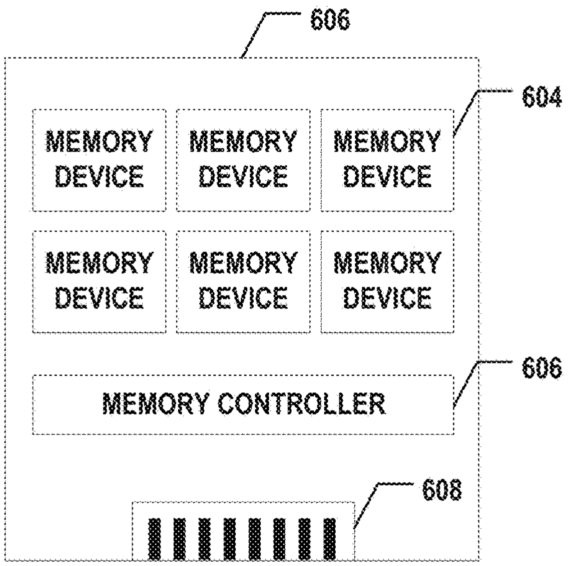
FIG. 6B illustrates a diagram of an exemplary solid-state drive (SSD) having a memory device, according to some aspects of the present disclosure.

Memory controller 506 and one or more memory devices 504 can be integrated into various types of storage devices, for example, be included in the same package, such as a universal Flash storage (UFS) package or an eMMC package. That is, memory system 502 can be implemented and packaged into different types of end electronic products. In one example as shown in FIG. 6A, memory controller 506 and a single memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 602 can further include a memory card connector 604 coupling memory card 602 with a host (e.g., host 508 in FIG. 5). In another example as shown in FIG. 6B, memory controller 506 and multiple memory devices 504 may be integrated into an SSD 606. SSD 606 can further include an SSD connector 608 coupling SSD 606 with a host (e.g., host 508 in FIG. 5). In some implementations, the storage capacity and/or the operation speed of SSD 606 is greater than those of memory card 602.

The foregoing description of the specific implementations will so reveal the general nature of the present disclosure that others can, by applying knowledge within the skill of the art, readily modify and/or adapt for various applications such specific implementations, without undue experimentation, without departing from the general concept of the present disclosure. Therefore, such adaptations and modifications are intended to be within the meaning and range of equivalents of the disclosed implementations, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A three-dimensional (3D) memory device, comprising:

a memory array structure comprising a first memory array structure and a second memory array structure each comprising a plurality of conductive/dielectric layer pairs; and a staircase structure between the first memory array structure and the second memory array structure in a first lateral direction, the staircase structure comprising a first staircase zone and a second staircase zone adjacent to the first staircase zone in a second lateral direction perpendicular to the first lateral direction, wherein:

the first staircase zone comprises at least one staircase, the at least one staircase comprising a first staircase and a second staircase each comprising a plurality of stairs, the first staircase and the second staircase being aligned in the first lateral direction;

the second staircase zone comprises a bridge structure and at least one other staircase arranged over the bridge structure and each comprising a plurality of stairs, the at least one other staircase is adjacent to and directly adjoining one of the first staircase and the second staircase in the second lateral direction, the bridge structure connecting the first memory array structure and the second memory array structure;

at least one stair in the at least one staircase that comprises the first and second staircases is electrically connected to the bridge structure, and the at least one stair of the at least one staircase, in the first staircase zone, extends in the second lateral direction to be connected with a corresponding conductive portion of the bridge structure in the second staircase zone;

a stair of the second staircase that faces a lowest stair in the first staircase is higher than a stair of the first staircase that faces a highest stair in the second staircase by one conductive/dielectric pair; and each stair of the first staircase is positioned at a vertical depth different from any stair of the second staircase, and each stair of the first staircase is electrically connected to the second memory array structure, adjacent to the second staircase, through the bridge structure.

2. The 3D memory device of claim 1, wherein:

the first staircase and the second staircase are aligned in the first lateral direction and face each other.

3. The 3D memory device of claim 2, wherein:

the bridge structure comprises a plurality of conductive/dielectric portion pairs; and each pair of the conductive/dielectric portion pairs is in contact with a conductive/dielectric layer pair of a same depth in each of the first memory array structure and the second memory array structure.

4. The 3D memory device of claim 2, wherein:

each stair in the first staircase and the second staircase is in contact with a respective conductive/dielectric portion pair in the bridge structure; and each stair in the first staircase and the second staircase is electrically connected to a respective conductive/dielectric layer pair in each of the first memory array structure and the second memory array structure through the respective conductive/dielectric portion pair of the bridge structure.

5. The 3D memory device of claim 2, wherein:

the at least one other staircase of the second staircase zone comprises a third staircase and a fourth staircase over the bridge structure; and each stair in the third staircase and the fourth staircase is in contact with and electrically connected to a respective conductive/dielectric layer pair in one of the first memory array structure and the second memory array structure.

6. The 3D memory device of claim 5, wherein:

the third staircase and the fourth staircase have a same number of stairs; and at a same depth in a vertical direction, one of the stairs in the third staircase and one of the stairs in the fourth staircase are conductively connected through a conductive line, and are respectively in contact with and electrically connected to conductive/dielectric layer pairs of a same depth in one of the first memory array structure and the second memory array structure.

7. The 3D memory device of claim 2, wherein:

the at least one other staircase of the second staircase zone comprises a third staircase and a fourth staircase over the bridge structure; and in a vertical direction, the first staircase and the second staircase are lower than each of the third staircase and the fourth staircase.

8. The 3D memory device of claim 7, wherein a highest stair in the first staircase is lower than a lowest stair of the second staircase by one conductive/dielectric portion pair of the bridge structure.

9. The 3D memory device of claim 2, wherein:

the at least one other staircase of the second staircase zone comprises a third staircase and a fourth staircase over the bridge structure; and each stair in the first staircase, the second staircase, the third staircase, and the fourth staircase is defined by an edge of one conductive/dielectric pair.

10. The 3D memory device of claim 2, wherein:

the at least one other staircase of the second staircase zone comprises a third staircase, a fourth staircase, a fifth staircase, and a sixth staircase over the bridge structure, the fifth staircase being aligned with the third staircase in the second lateral direction, the sixth staircase being aligned with the fourth staircase in the second lateral direction, the fifth staircase and the sixth staircase each comprising a plurality of stairs.

11. The 3D memory device of claim 10, wherein each stair in the first staircase, the second staircase, the third staircase, the fourth staircase, the fifth staircase, and the sixth staircase is defined by an edge of two conductive/dielectric pairs.

12. The 3D memory device of claim 10, wherein in a vertical direction, a highest stair of the third staircase and a highest stair of the fourth staircase are of a same depth;

a highest stair of the fifth staircase is lower than a highest stair of the third staircase by one conductive/dielectric pair; and a highest stair of the sixth staircase is lower than a highest stair of the fourth staircase by one conductive/dielectric pair.

13. The 3D memory device of claim 10, wherein in a vertical direction, a highest stair among all stairs of the first staircase and the second staircase is located in the second staircase, and a lowest stair among all the stairs of the first staircase and the second staircase is located in the first staircase.

14. The 3D memory device of claim 12, wherein:

in the first lateral direction, the third staircase faces the fourth staircase, and the fifth staircase faces the sixth staircase; and at a same depth in the vertical direction, one of the stairs in the third staircase and one of the stairs in the fourth staircase being conductively connected through a conductive line, one of the stairs in the fifth staircase and one of the stairs in the sixth staircase being conductively connected through another conductive line.

15. The 3D memory device of claim 12, wherein:

in the first lateral direction, the third staircase faces the sixth staircase, and the fourth staircase faces the fifth staircase; and at a same depth in the vertical direction, one of the stairs in the third staircase and one of the stairs in the sixth staircase being conductively connected through a conductive line, one of the stairs in the fifth staircase and one of the stairs in the fourth staircase being conductively connected through another conductive line.

16. The 3D memory device of claim 1, wherein each stair in the first staircase, located at a side closer to the first memory array structure in the first lateral direction, is electrically connected to the second memory array structure through the bridge structure of the second staircase zone.

17. The 3D memory device of claim 1, wherein each stair of the plurality of stairs in the first staircase is lower than any stair of the plurality of stairs in the second staircase, the second staircase being aligned with and facing the first staircase in the first lateral direction.

18. The 3D memory device of claim 1, wherein:

the first staircase faces the second staircase and is aligned with the second staircase in the first lateral direction; and the plurality of stairs of the first staircase and the plurality of stairs of the second staircase are arranged at alternating vertical levels in a vertical direction.

19. A three-dimensional (3D) memory device, comprising:

a memory array structure comprising a first memory array structure and a second memory array structure each comprising a plurality of conductive/dielectric layer pairs; and a staircase structure arranged between the first memory array structure and the second memory array structure in a first lateral direction and comprising a first staircase zone and a second staircase zone arranged in a second lateral direction perpendicular to the first lateral direction, the first staircase zone being adjacent to the second staircase zone in the second lateral direction, wherein:

the first staircase zone comprises a first staircase and a second staircase each comprising a plurality of stairs;

the second staircase zone comprises a bridge structure and a plurality of staircases over the bridge structure, the bridge structure being configured to connect the first memory array structure and the second memory array structure;

one stair of the first staircase, away from the second memory array structure, is connected with the second memory array structure through the bridge structure of the second staircase zone;

the first staircase faces and is aligned with the second staircase in the first lateral direction; and in a vertical direction perpendicular to the first and second lateral directions, each stair of the first staircase is positioned at a depth different from any stair of the second staircase facing the first staircase, and a highest stair in the first staircase is lower than a highest conductive/dielectric portion pair of the second staircase by one conductive/dielectric pair.

20. A three-dimensional (3D) memory device, comprising:

a memory array structure comprising a first memory array structure and a second memory array structure each comprising a plurality of conductive/dielectric layer pairs; and a staircase structure arranged between the first memory array structure and the second memory array structure in a first lateral direction and comprising a first staircase zone and a second staircase zone arranged in a second lateral direction perpendicular to the first lateral direction, the first staircase zone being adjacent to the second staircase zone in the second lateral direction, wherein:

the first staircase zone comprises a first staircase and a second staircase each comprising a plurality of stairs, the first staircase facing and being aligned with the second staircase in the first lateral direction;

the second staircase zone comprises a bridge structure and a plurality of staircases over the bridge structure, the bridge structure being configured to connect the first memory array structure and the second memory array structure, one staircase of the plurality of staircases of the second staircase zone being adjacent to one of the first staircase and the second staircase in the second lateral direction;

one stair of the first staircase, away from the second memory array structure, is connected with the second memory array structure through the bridge structure of the second staircase zone, the one stair of the first staircase extends in the second lateral direction to be connected to a corresponding conductive portion of the bridge structure in the second staircase zone; and in a vertical direction perpendicular to the first and second lateral directions, each stair of the first staircase is positioned at a depth different from any stair of the second staircase facing the first staircase, and the plurality of stairs of the first staircase and the plurality of stairs of the second staircase are arranged at alternating vertical levels in a vertical direction perpendicular to the first lateral direction and the second lateral direction.

* * * * *